(12) United States Patent
Akimoto et al.

(10) Patent No.: US 7,098,087 B2
(45) Date of Patent: Aug. 29, 2006

(54) MANUFACTURING METHOD OF SEMICONDUCTOR DEVICE

(75) Inventors: Kengo Akimoto, Atsugi (JP); Toru Takayama, Atsugi (JP); Tetsuji Yamaguchi, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/631,776

(22) Filed: Aug. 1, 2003

(65) Prior Publication Data

US 2004/0021177 A1    Feb. 5, 2004

(30) Foreign Application Priority Data

Aug. 2, 2002    (JP) ............... 2002-226056

(51) Int. Cl.
*H01L 21/84* (2006.01)
(52) U.S. Cl. .............. 438/151; 438/149; 438/164; 438/788; 438/792
(58) Field of Classification Search ........ 438/151, 438/164–166, 149, 216, 787–788, 791–792
See application file for complete search history.

(56) References Cited

U.S. PATENT DOCUMENTS

| 4,951,601 A | 8/1990 | Maydan et al. |
| 5,043,299 A | 8/1991 | Chang et al. |
| 5,286,296 A | 2/1994 | Sato et al. |
| 5,306,651 A | 4/1994 | Masumo et al. |
| 5,310,410 A | 5/1994 | Begin et al. |
| 5,324,360 A | 6/1994 | Kozuka |
| 5,587,520 A | 12/1996 | Rhodes |
| 6,177,302 B1 | 1/2001 | Yamazaki et al. |
| 6,261,877 B1 | 7/2001 | Yamazaki et al. |
| 6,323,142 B1 | 11/2001 | Yamazaki et al. |
| 6,323,528 B1 | 11/2001 | Yamazaki et al. |

(Continued)

FOREIGN PATENT DOCUMENTS

| JP | 05-044017 | 2/1993 |
| JP | 10-084085 | 3/1998 |

OTHER PUBLICATIONS

Specification, Claims, Abstract and drawings of U.S. Appl. No. 10/439,295, filed May 16, 2003 entitled *Silicon Nitride Film and Semiconductor Device, and Manufacturing Method Thereof.*

*Primary Examiner*—Thanh Nguyen
(74) *Attorney, Agent, or Firm*—Eric J. Robinson; Robinson Intellectual Property Law Office, P.C.

(57) ABSTRACT

It is an object of the present invention is to provide a technique for forming a dense insulating film of good quality that is applicable to a transistor made on a substrate weak against heat such as a glass and a semiconductor device that can realize high performance and high reliability using the technique. In the present invention a silicon oxide film is formed on a crystalline semiconductor film, which is formed on an insulating surface, by the sputtering method using silicon as a target by applying high-frequency power in an atmosphere containing oxygen or oxygen and a rare gas, a silicon nitride film is formed thereon by applying high-frequency power in an atmosphere containing nitrogen or nitrogen and a rare gas, and then, heat treatment of a stacked body of the crystalline semiconductor film, the silicon oxide film, and the silicon nitride film at a temperature higher than a temperature for forming the films is performed.

14 Claims, 13 Drawing Sheets

U.S. PATENT DOCUMENTS

| | | |
|---|---|---|
| 6,329,229 B1 | 12/2001 | Yamazaki et al. |
| 6,492,659 B1 | 12/2002 | Yamazaki et al. |
| 6,492,681 B1 | 12/2002 | Koyama et al. |
| 6,498,369 B1 | 12/2002 | Yamazaki et al. |
| 6,555,843 B1 | 4/2003 | Yamazaki et al. |
| 6,599,818 B1 | 7/2003 | Dairiki |
| 6,614,076 B1 * | 9/2003 | Kawasaki et al. .......... 257/350 |
| 6,822,261 B1 | 11/2004 | Mase et al. |
| 2001/0009283 A1 | 7/2001 | Arao et al. |
| 2001/0015441 A1 | 8/2001 | Kawasaki et al. |
| 2002/0001886 A1 | 1/2002 | Ohtani |
| 2002/0043660 A1 | 4/2002 | Yamazaki et al. |
| 2002/0101395 A1 | 8/2002 | Inukai |
| 2002/0110940 A1 | 8/2002 | Yamagata et al. |
| 2002/0113248 A1 | 8/2002 | Yamagata et al. |
| 2002/0121860 A1 | 9/2002 | Seo et al. |
| 2002/0160554 A1 | 10/2002 | Isobe et al. |
| 2003/0013280 A1 * | 1/2003 | Yamanaka .................. 438/487 |
| 2004/0077134 A1 | 4/2004 | Takayama |

* cited by examiner

MANUFACTURING METHOD OF SEMICONDUCTOR DEVICE

BACKGROUND OF THE INVENTION

1. Field of the Invention

The present invention relates to a semiconductor device including an insulating film made by high frequency sputtering method using silicon as a target and a manufacturing method of the same. More particularly, the present invention relates to a gate structure of an insulated gate field effect transistor, typified by a thin film transistor (TFT).

2. Description of the Related Art

It is a known technique is that a TFT formed on a substrate such as a glass substrate, a liquid crystal or an electroluminescence (EL) material and a pixel combined with an element thereof is arranged in a matrix to make a display showing characters or images. A TFT, wherein a channel portion overlapped with a gate electrode is formed with a polycrystalline silicon film, can operate a logic circuit or the like at a suitable frequency.

A polycrystalline silicon film for this purpose is an amorphous silicon film crystallized by a laser annealing method or the like. Of course, the electrical property and reliability depend not only on the quality of the polycrystalline silicon film, but also on the quality of a gate insulating film or a base insulating film contacting with the polycrystalline silicon film.

In a MOS transistor formed on a single crystalline silicon substrate a high quality gate insulating film can be formed, utilizing a thermal oxidation technique effectively. However, in making a liquid crystal display using a glass whose distortion point is 700° C. or less as a substrate, a technique to deposit films using a chemical or physical phenomenon is adopted. This is different point from the manufacturing technique of silicon integrated circuit including a heat process at 700° C. or more.

Focusing on the gate insulating film of a transistor, a desired property is that the gate insulating film is a dense film without holes and pinholes, including no mobile ions. Further, the gate insulating film has low defect level density due to its fineness and has less leak current such as gate leak.

However, insulating films such as silicon oxide and silicon nitride that are deposited using chemical or physical reaction by conventional plasma CVD or sputtering method have a disadvantage such as defect and pinholes resulted from being easily damaged by charged particles, fixed charge or high interface state level. Also, it lacks in a thermal stability due to several atoms percent of hydrogen contained in the insulating film. And it is also a cause of a characteristic deterioration such as fluctuation in a threshold voltage or increase of a gate leak current.

On the other hand, as an integrated circuit made with TFTs becomes more micro fabricated, much thinner film of a gate insulating film is more important based on scaling law. It has been impossible for a silicon oxide film or a silicon nitride film deposited at 400° C. or less to obtain a desired characteristic with reducing fixed charges and interface state level densities, as contrasted to a pure silicon oxide film that is oxidized at 900° C. or more.

SUMMARY OF THE INVENTION

The present invention has been made in view of the above problems and an object of the present invention is to provide a technique for forming the insulating film of good quality and fineness that is applicable to a transistor made on a substrate weak against heat such as a glass and a semiconductor device that can realize high performance and high reliability using the technique. Also, another object of the present invention is to provide the semiconductor device having a large area integrated circuit that a transistor made of superior insulating layers is used as a component element.

In order to obtain the above-mentioned objects, in the present invention, a silicon oxide film is formed on a crystalline semiconductor film, which is formed on an insulating surface, with the sputtering method using silicon as a target by applying high-frequency power in an atmosphere containing oxygen or oxygen and a rare gas, a silicon nitride film is formed thereon by applying high-frequency power in an atmosphere containing nitrogen or nitrogen and a rare gas, and then, a heat treatment to a stacked body of the crystalline semiconductor film, the silicon oxide film, and the silicon nitride film at a temperature higher than a temperature for forming the films is performed.

The heat treatment is performed at a temperature of 600 to 800° C., while the film formation of the silicon oxide film and the silicon nitride film is performed at a temperature of 300° C. or less. There is no specific limitation about a technique of the heat treatment, and the heat treatment using a furnace anneal may be adopted. However, preferably, the heat treatment is performed by a rapid heating with a rapid thermal annealing (RTA) method or a lamp heating, and the heating time thereof is 1 to 240 seconds. An atmosphere for the heating processing may be in nitrogen, inert gas, or oxygen atmosphere.

In the above-mentioned structure of the present invention, it is most preferable to apply a high-frequency sputtering apparatus to the sputtering method. It is desirable to apply high-frequency power in order to generate and maintain discharge at a low voltage because silicon with a high specific resistance compared with metal is used as a target. A power frequency to be applied is 1 MHz or more and 120 MHz or less, preferably 10 MHz or more and 60 MHz or less. In the coverage of this frequency, as the frequency increases, a sheath potential decreases and film formation through a chemical reaction becomes predominant, whereby a dense film of a CVD mode can be formed.

A representative form of a manufacturing method of a semiconductor device according to the present invention is to form a silicon oxide film and a silicon nitride film on a crystalline semiconductor film by a high-frequency sputtering method, subject the films to heat treatment, and then, form a conductive film thereon with a DC sputtering method with metal as a target. Since all the steps that are described above are continuously performed without exposing the films to the atmosphere, physical contamination due to particulates or the like and chemical contamination due to an environment around the films are prevented and a clean interface can be formed.

In addition, another form is characterized by having steps of forming a crystalline semiconductor film on a substrate having an insulating surface, forming a stacked body on an upper layer side thereof by sequentially depositing a silicon oxide film formed by applying high-frequency power in an atmosphere containing oxygen or oxygen and a rare gas and a silicon nitride film formed by applying high-frequency power in an atmosphere containing nitrogen or nitrogen and a rare gas by the sputtering method using silicon as a target, performing a heat treatment for the stacked body by a rapid thermal annealing method (RTA method) for heating the stacked body to a temperature equal to or higher than a distortion point of the substrate, and then, forming a gate electrode to form the crystalline semiconductor film in an island shape with a position of the gate electrode as a reference, thereby deciding a position of a channel portion of a thin film transistor. A representative heat treatment temperature by the rapid thermal annealing method (RTA method) is 600 to 800 °C., and preferably, the deformation of the substrate can be controlled to be minimum even if a temperature is equal to or higher than the distortion point of the substrate depending upon a heating time of 1 to 240 seconds.

In the sputtering method applied in the present invention, only oxygen gas or nitrogen gas can be used as a sputtering gas. During high-frequency discharge of oxygen or nitrogen, various ion species, excited species, and luminous species, and various radicals (chemically active species which is electrically neutral and high in responsiveness) are formed. The inventors found that, among them, an oxygen radical or a nitrogen radical having a chemically extremely active characteristic is generated, and the oxygen radical or the nitrogen radical can react with silicon serving as a target material to form a dense film. That is, the oxygen radical or the nitrogen radical diffused on the surface of the target reacts with silicon to form an oxide or a nitride. Although the oxide or the nitride formed on the surface of the target is stable, when an ion is accelerated in a sheath electric field and incident on the surface, the oxide or the nitride is sputtered to be emitted into a gas phase and deposits on a substrate (including a reaction process in the gas phase), thereby making it possible to form a film.

In order to increase a spattering speed, a rare gas may be added to the oxide or the nitride. However, it is desirable to set a ratio of the rare gas to oxygen or nitrogen to 50% or less. If the ratio of the rare gas is set higher than that of oxygen or nitrogen, such a film forming mechanism cannot be realized because sputtering due to a rare gas ion becomes predominant. It is ideal to use only oxygen gas or nitrogen gas. However, since a film forming speed may extremely slows down, it is possible to select a mixing ratio of oxygen and a rare gas or nitrogen and a rare gas in a range in which a maximum ratio is 1:1.

In the film formation of the silicon oxide film and the silicon nitride film, the silicon oxide film and the silicon nitride film may be formed individually using different silicon targets and sputtering gases or may be continuously stacked and formed by using a common silicon target and switching types of a sputtering gas. In the latter case, a mode may be adopted in which, after forming the silicon oxide film, both oxygen and nitrogen are contained therein to form a silicon oxynitride film, and then, a silicon nitride film is formed using nitrogen or nitrogen and a rare gas as the sputtering gas. That is, a stacked body of the silicon oxide film, the silicon oxynitride film, and the silicon nitride film may be formed.

A relatively dense oxide film or nitride film can be formed even under a low temperature equal to or lower than 300° C. by a film forming method utilizing a so-called chemical reaction with which a film is formed by reacting a silicon target and radical species of oxygen or nitrogen.

Moreover, the heat treatment performed at the temperature of 600 to 800° C. acts effectively in order to reduce silicon clusters contained in the silicon oxide film or the silicon nitride film and remove distortion of an interface. This action of the heat treatment has been confirmed in capacitance characteristics of a MOS structure, and it has been proved that hysteresis is reduced by the heat treatment in the above-mentioned temperature range. A characteristic of the stacked body of the silicon oxide film and the silicon nitride film of the present invention is that, in a C-V characteristic of the MOS structure, a fluctuation value of a flat-band voltage due to hysteresis before and after a bias thermal stress test (BT test) is 0.5 V or less, preferably 0.3 V or less. This fluctuation value of the flat-band voltage is a numerical value which is attained by the heat processing at 600 to 800° C. By specifying the fluctuation value of the flat-band voltage in the C-V characteristic of the MOS structure, a stacked body of a silicon oxide film and a silicon nitride film with a low fixed charge density or interface level density is selected, and a stable current voltage characteristic without hysteresis can be obtained in a transistor.

In the present invention, an etching characteristic, which is an important element for attaining the object of the present invention, is specified with an etching speed by a specific etching liquid. As the etching liquid, a mixed water solution containing 7.13% of ammonium hydrogen fluoride ($NH_4HF_2$) and 15.4% of ammonium fluoride ($NH_4F$) is used to evaluate an etching speed at a constant temperature thereof. With this etching liquid, in the case in which commercially available synthetic quartz is etched, the etching speed of 60 nm/min is obtained in a room temperature. In addition, in a silicon oxide film or a silicon nitride film which is deposited and formed by some form such as the plasma CVD method or the sputtering method, the etching speed by the etching liquid changes variously depending upon conditions of formation of the film. For example, it has been found that a silicon oxynitride film which is deposited and formed by the plasma CVD method changes from 25 to 330 nm/min.

The silicon oxide film which is manufactured by the high-frequency sputtering method using silicon as a target in the present invention is characterized in that an etching speed at the temperature of 20° C. of the etching liquid is 100 nm/mm or less. In addition, the silicon nitride film which is manufactured by the high-frequency sputtering method using silicon as a target obtained in the present invention is characterized in that an etching speed at the temperature of 20° C. of the etching liquid is 10 nm/mm or less.

Application of the stacked body of the silicon oxide film and the silicon nitride film to a gate insulating film means substantial thinning of the gate insulating film. Since a relative dielectric constant of the silicon nitride is approximately 7.5 as opposed to 3.8 of the silicon oxide, by containing the silicon nitride film in a gate insulating film formed of the silicon oxide film, an effect substantially equivalent to realizing thinning of the gate insulating film can be obtained, and it becomes possible to reduce gate leak. An advantageous effect can be obtained with respect to refining of elements based upon a scaling rule. Moreover, by using a dense silicon nitride film as a constituent member of the gate insulating film, the gate insulating film can be caused to function as a protective film for preventing intrusion of impurities from the outside, and a clean interface can be formed between the gate insulating film and the semiconductor film.

According to the characteristics of the present invention, it is useful to provide the insulating stacked body consisting of the silicon oxide film and the silicon nitride film with a fluctuation value of the flat-band voltage in the bias thermal stress test, in which an electric field intensity of 1.7 MV/cm is applied for one hour at 150° C., of 0.5 V or less between the crystalline semiconductor film and the gate electrode, and the insulating stacked body can be used as a gate insulating film for a transistor of an insulating gate type.

DESCRIPTION OF THE PREFERRED EMBODIMENTS

[Embodiment Mode 1]

A stacked body of a silicon oxide film, which is formed by the sputtering method by applying high-frequency power in an atmosphere containing oxygen or oxygen and a rare gas using silicon as a target, and a silicon nitride film, which is formed by the sputtering method by applying high-frequency power in an atmosphere containing nitrogen or nitrogen and a rare gas is used as a gate insulating film of an insulated gate field effect transistor, which is a main component of a semiconductor device, typically a thin film transistor (TFT). The stacked body is deposited and formed at a substrate heating temperature of 400° C. or less, preferably 300° C. or less and is thereafter capable of reducing a defect density on a stacked layer interface or a defect density in a film and distortion by a heat treatment at a temperature higher than that. Preferably by performing a heat treatment at the temperature of 600 to 800 ° C., and particularly preferably by performing rapid heating for 1 to 240 seconds with the rapid thermal annealing (RTA), it becomes possible to obtain an effect of the same quality and, at the same time, suppress distortion due to heat even for a glass substrate which is thermally fragile with a distortion point of 700° C. or less even in the above-mentioned temperature range.

Figure 5:
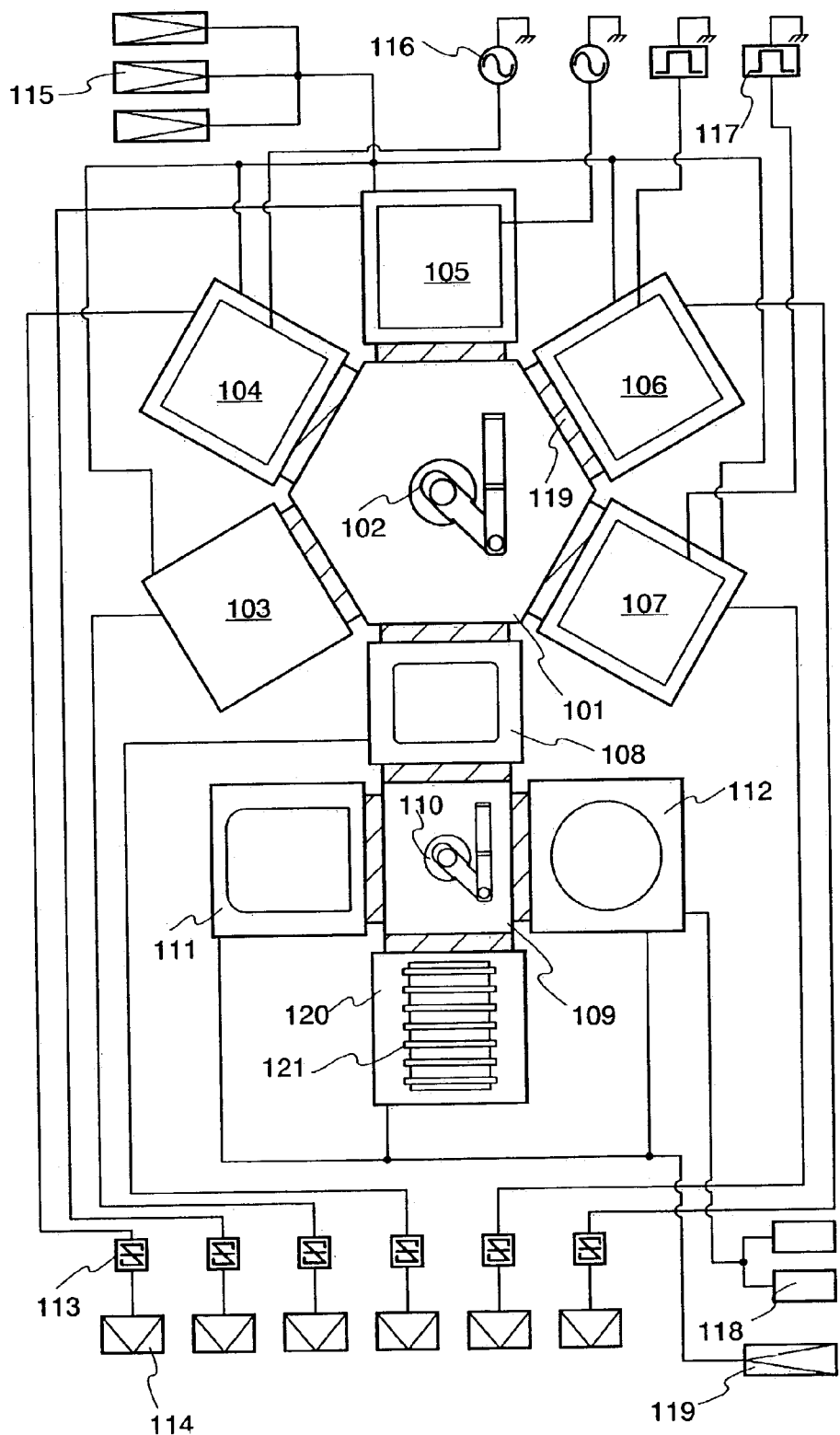
FIG. 5 is a top diagram showing a structure of the magnetron-sputtering apparatus adopted in the present invention.

FIG. 5 is a diagram showing a form of a multi-task manufacturing apparatus provided with plural treatment chambers which can be applied in implementing the present invention. A structure of the manufacturing apparatus shown in FIG. 5 is provided with plural film forming chambers, which is capable of forming a film through sputtering via a gate valve, with respect to a first common chamber 101 provided with a conveying unit 102 for a substrate. In addition, a load/unload chamber 111, a pre-treatment chamber 112, and a heat treatment chamber 120 are provided via the gate valve with respect to a second common chamber 109 provided with conveying unit 110 for a substrate. Then, the first common chamber 101 and the second common chamber 109 are connected via an intermediate chamber 108. In particular, in forming a gate insulating film of a TFT, in order to stack and form a silicon oxide film and a silicon nitride film on a crystalline semiconductor film, it is most important to sequentially form plural films with different properties without exposing them to the atmosphere and contaminating an interface thereof when the silicon nitride film is formed. The structure of the manufacturing apparatus shown in FIG. 5 makes this possible.

The substrate is loaded in the load/unload chamber 111 and is conveyed by the conveying unit 110 provided in the second common chamber 109. The pre-treatment chamber 112 is provided with a spinner for rotating the substrate and is capable of performing treatment such as cleaning of a deposited surface, forming of an oxide film, and etching through application of various chemicals to be supplied from a chemical supply unit 118. The load/unload chamber 111, the second common chamber 109, the pre-treatment chamber 112 supplies inert gas such as nitrogen or argon with a gas supply unit 119, and the operation is performed in an atmosphere substituted by the gas. The intermediate chamber 108 is provided as a chamber for exchanging the substrate between the second common chamber 109 and the first common chamber 101 for decompressing the inside thereof, and is a chamber for fluctuating a pressure in the inside from a normal pressure to a reduced pressure at the time of sending or receiving the substrate. For this purpose, the intermediate chamber 108 may be provided with a cassette holder or the like for temporarily holding all substrates loaded in the load/unload chamber 111.

Figure 7:
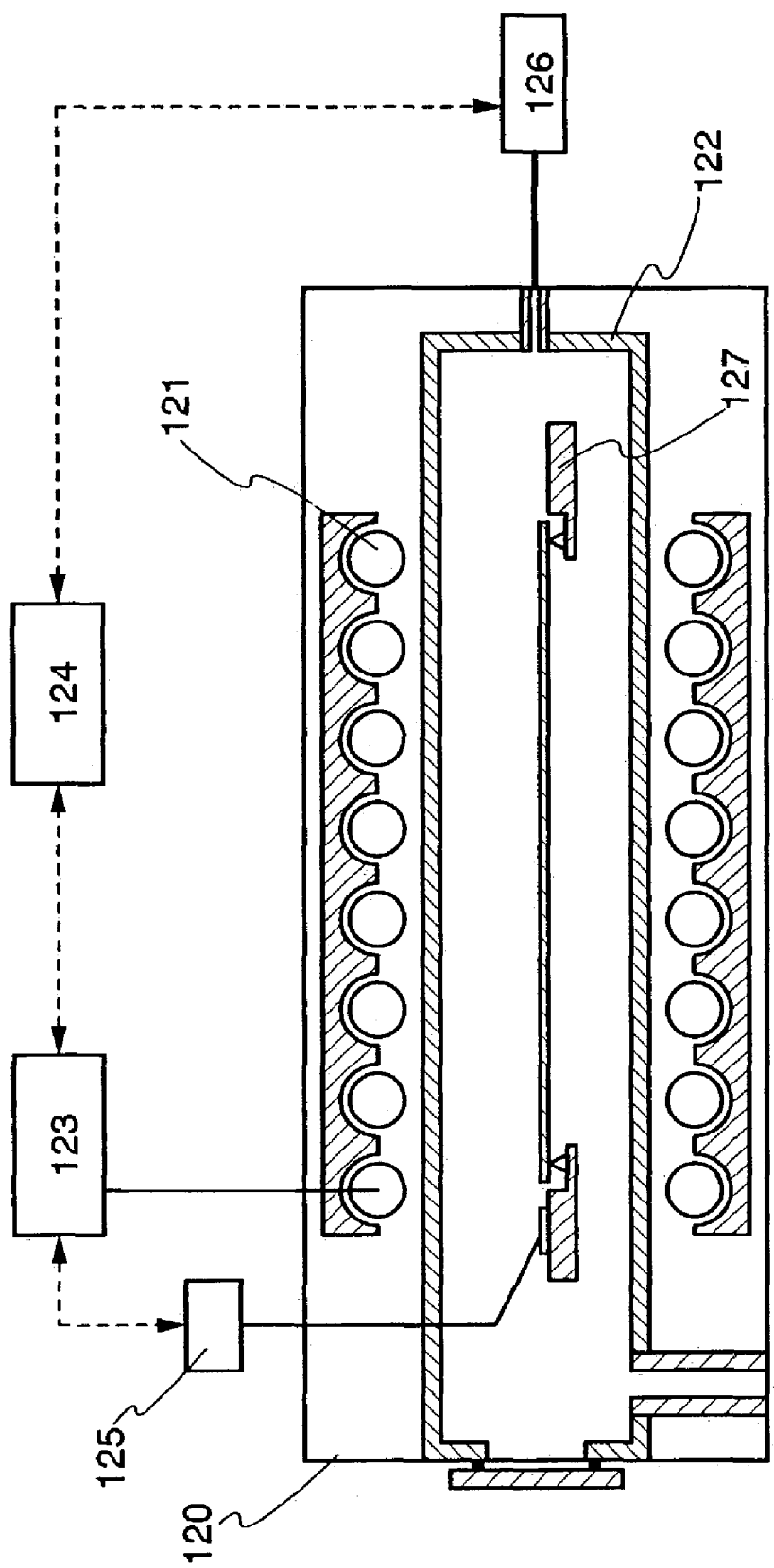
FIG. 7 is a cross sectional view showing an example of heat treatment chamber of the magnetron-sputtering apparatus adopted in the present invention.

The heat treatment chamber 120 for applying the rapid thermal annealing (RTA) method is provided with a thermal unit 121. A detailed structure of the heat treatment chamber 120 is shown in FIG. 7. The heat treatment chamber 120 is provided with a reaction tube 122 formed of quartz, and a heat source 121 is provided outside thereof. There is a substrate holder 127 formed of quartz in the inside of the reaction tube 122, and the substrate is set on this substrate holder 127. In this case, a treated substrate is placed on a pin in order to realize uniformity of a temperature distribution. In addition, here, a temperature detector 125 using a thermocouple is provided with means for monitoring a temperature applied by the heat source 121. The heat source 121 constituted by a halogen lamp, a metal halide lamp, or the like is controlled to be turned on and off by a power supply 123. A control unit 124 includes a computer and associates operations of this power supply 123 and a gas supply unit 126 each other in accordance with a program.

The treated substrate placed under a room temperature is rapidly heated by the heat source 121. During a temperature rising period, the treated substrate is heated to a set temperature (e.g., 700° C.) at a temperature rising speed of 100 to 200° C./sec. For example, if the treated substrate is heated at the temperature rising speed of 100° C./sec, it can be heated to 700° C. in seven seconds. Thereafter, the treated substrate is held on the set temperature for a fixed time and, thereafter, the heat source 121 is turned off the. The holding time is set to 1 to 240 seconds.

In FIG. 5, targets of different materials are mounted on the film forming chambers 104 to 107, whereby plural films can be stacked and formed continuously under a reduced pressure. Each film forming chamber is provided with a gas supply unit 115 for supplying sputtering gasses, an exhaust unit 114, and a pressure control unit 113. The film forming chambers 104 and 105 are provided with a semiconductor target and are jointly provided with a high-frequency power supply 116 in order to perform sputtering. As a frequency of electric power supplied by the high-frequency power supply 116, a frequency of 1 MHz or more and 120 MHz or less, preferably 10 MHz or more and 60 MHz or less is applied. Usually, since a sheath potential decreases as a frequency increases, the film formation through a chemical reaction becomes predominant, whereby a dense film of a CVD mode can be formed. In addition, the film forming chambers 106 and 107 are provided with a metal target and are jointly provided with a DC power supply 117. A preliminary heating chamber 103 is provided for the purpose of performing heating and evaporation treatment in advance under a reduced pressure before forming a film.

Figure 6:
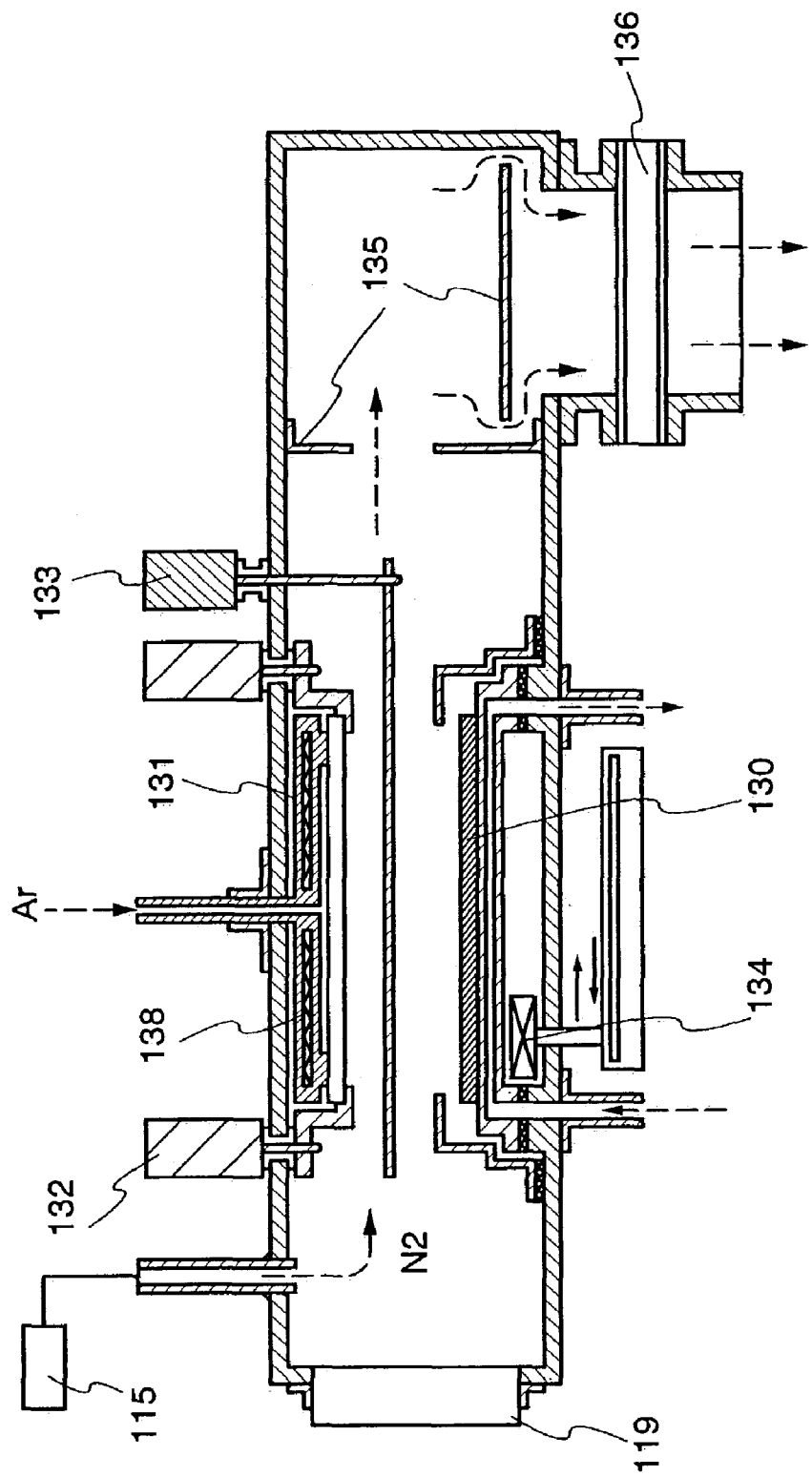
FIG. 6 is a cross sectional view showing an example of film forming chamber of the magnetron-sputtering apparatus adopted in the present invention.

FIG. 6 is a view illustrating details of the film forming chamber 104 as an example. The film forming chamber 104 is a place for forming a silicon oxide film in accordance with the present invention. A target 130 is silicon, which is cooled by a coolant through a backing plate. A permanent magnet 134 takes a circular motion or linear motion in a direction parallel with a target surface, thereby making it possible to form a film with high uniformity of a thickness on a substrate surface opposed to it. A shutter 133 opens and closes before and after starting film formation and prevents a film from being formed in an unstable state of plasma at an initial period of discharge. A substrate holding unit 132 mounts and fixes the substrate on a back plate 131 with vertical movement of a holder thereof. A sheathed heater is embedded in the back plate 131 as a heating unit 138, and heated a rare gas is introduced therein from a back side of the substrate to increase a soaking property. Oxygen gas is introduced from the gas supply unit 115 as well as the rare gas, and a pressure in the film forming chamber 104 is controlled by a conductance valve 136. A gas distributor 135 is provided for the purpose of distributing a flow of the sputtering gas in the film forming chamber 104. The target is connected to the high-frequency power supply and applied with high-frequency power, whereby sputtering is performed. Note that the film forming chamber 105 has the same structure.

Dense silicon oxide and silicon nitride films can be formed using silicon as a target by the high-frequency sputtering according to the structure shown in FIG. 6. As main film forming conditions for the silicon oxide film, silicon is used as a target, and oxygen or oxygen and a rare gas are used as a sputtering gas. For the silicon nitride film, similarly, a silicon target is used, and nitride or nitride and a rare gas are used as a sputtering gas. Although a frequency of a high-frequency power to be applied is typically 13.56 MHz, a frequency of 27 to 120 MHz higher than that may be applied. As the frequency increases, a chemical reaction becomes more predominant for a mechanism for the film formation, and the formation of the film which is dense and with less damage to the base film can be expected. The rare gas used as the sputtering gas may be introduced from the back side of the substrate as shown in FIG. 6 and used as a gas for heating the substrate. As a heating temperature of the substrate, no heating may be performed specifically to perform film formation in a state of a room temperature. However, in order to further improve adhesion with the base, the substrate is heated to 100 to 300° C., preferably 150 to 200° C. Then, satisfactory adhesion can be obtained.

The sputtering method applied in this embodiment mode is a sputtering method in which a mixing ratio of oxygen and a rare gas or nitrogen and a rare gas is selected in a range in which a maximum ratio is 1:1. In particular, as radical species of oxygen or nitrogen are actively used for the reaction, the sputtering method is different from a film forming mechanism according to a conventional physical sputtering phenomenon using ion collusions. That is, it can be considered that a chemical film forming mechanism is predominant in that the sputtering method is characterized by causing radicals of oxygen or nitrogen and silicon to react with each other on a target surface and a film deposition surface.

Figure 8:
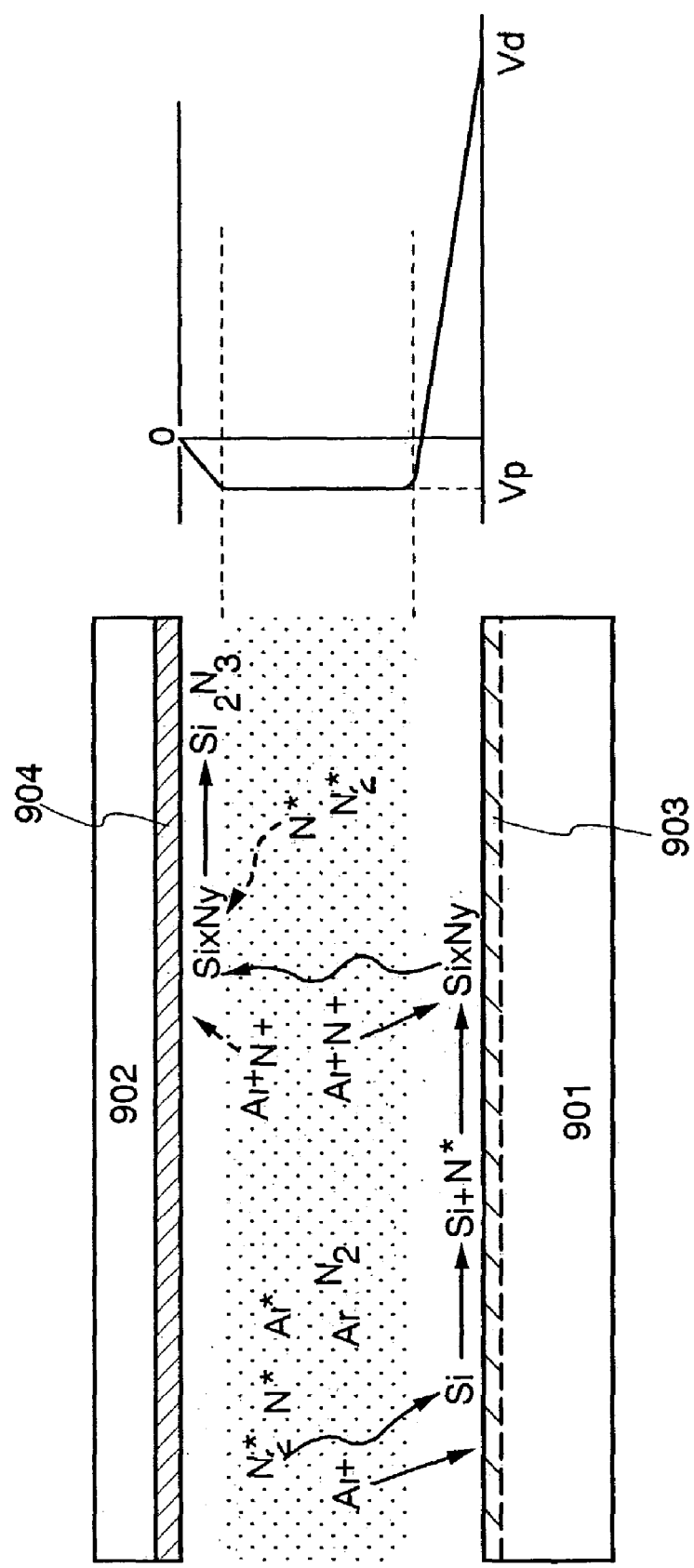
FIG. 8 schematically shows mechanism for forming a silicon nitride film by high-frequency magnetron sputtering according to the present invention.

An example of study of the film forming mechanism will be described with reference to a diagram FIG. 8. When glow discharge plasma is formed by applying high-frequency power to a target 901, radicals which are chemically extremely active among radicals of oxygen or nitrogen react with silicon even with low energy to form oxides or nitrides. That is, active radicals of oxygen or nitrogen diffused over a target surface react with silicon to form oxides or nitrides. Although the oxides or the nitrides of silicon are stable, when an ion is accelerated in a sheath electric field and conflict with the target surface, the oxides or the nitrides are sputtered to be emitted into a gas phase. The oxides or the nitrides of silicon diffusing in the glow discharge plasma undergo a gas phase reaction even in the plasma, and a part of them reaches a substrate surface. The oxides or the nitrides of silicon undergo a surface reaction there, whereby a film is formed. It is considered that assistance of ion species, which are accelerated by a potential difference between a plasma potential and a ground potential and conflict with the substrate surface, also acts in the surface reaction.

If a mixing ratio of the rare gas is set higher than that of oxygen or nitrogen to be supplied, sputtering by rare gas ions becomes predominant (i.e., physical sputtering becomes predominant), and such a film forming mechanism cannot be realized. It is ideal to use only oxygen gas or nitrogen gas. However, since a film forming speed extremely slows down it is preferable to select a mixing ratio of oxygen and a rare gas or nitrogen and a rare gas in a range in which a maximum ratio is 1:1.

Naturally, in terms of probability, a very small cluster of silicon may be mixed in a film sputtered to deposit. The silicon cluster taken into the silicon oxide or the silicon nitride film becomes defects of capturing charges and causes hysteresis.

The heat treatment, which is performed after forming this type of film by sputtering, becomes effective means for eliminating these defects. That is, by supplying oxygen or nitrogen the silicon cluster to form oxidize or nitride, generation of the charging defects can be eliminated. The oxidation reaction or the nitriding reaction is not limited to using oxygen or nitrogen supplied from the gas phase but may use excessive oxygen or nitrogen contained in the film.

A fluctuation value of a flat-band voltage in an MOS structure, which is specified in this embodiment mode as an important element for attaining an object thereof, is found and decided from a C-V characteristic before and after a BT stress application of a sample of an MOS structure formed of a stacked body consisting of a silicon oxide film and a silicon nitride film manufactured under various conditions. As a structure of the sample, a silicon oxide film of 30 nm and a silicon nitride film of 20 nm were formed on a single crystal silicon substrate (n-type, 1 to 10 106 cm) by the high-frequency sputtering method under various conditions, and an Al electrode with a diameter of 1 mm was formed thereon.

Figure 1:
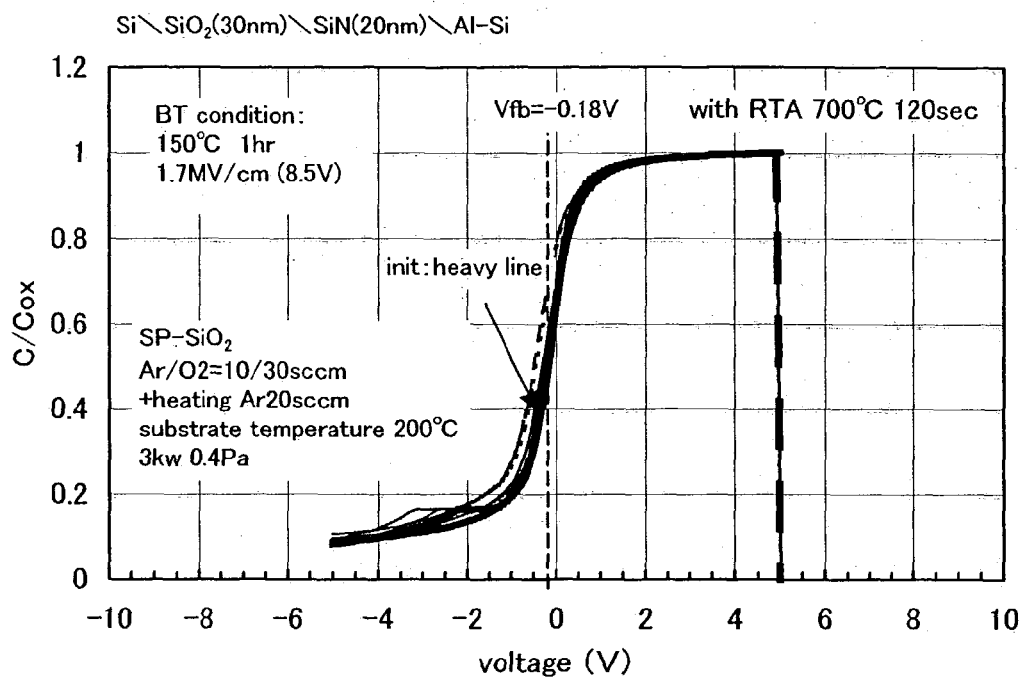
FIG. 1 is a graph showing a C-V characteristic in a sample of the MOS structure having a stacked body of a silicon oxide film and a silicon nitride film manufactured by the high-frequency sputtering method.
Figure 2:
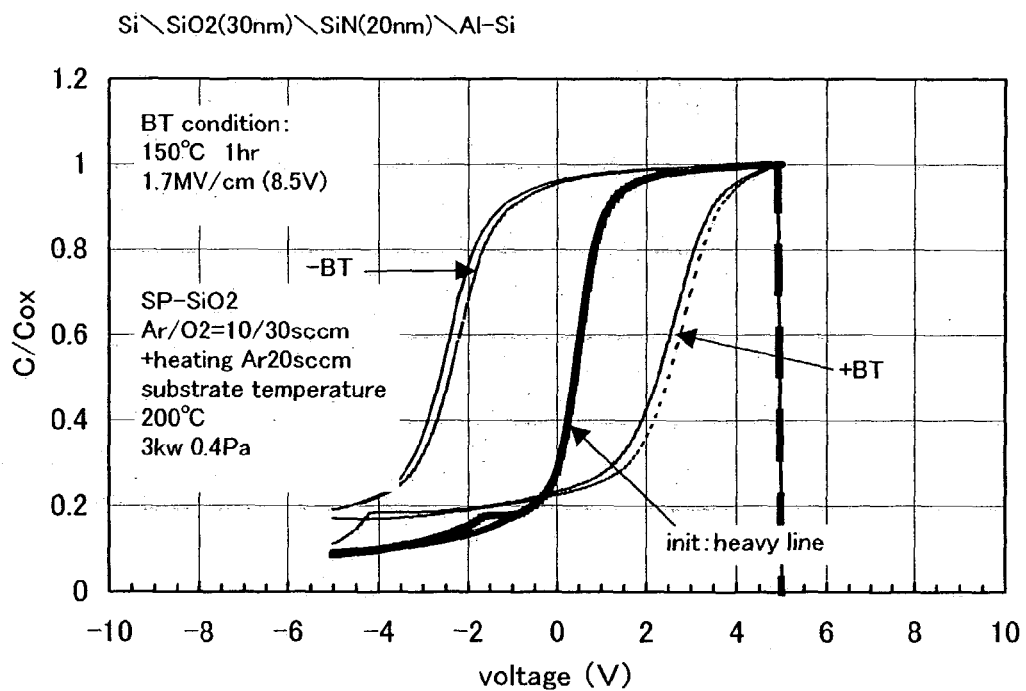
FIG. 2 is a graph showing a C-V characteristic in a sample of the MOS structure having a stacked body of a silicon oxide film and a silicon nitride film manufactured by the high-frequency sputtering method.
Figure 3:
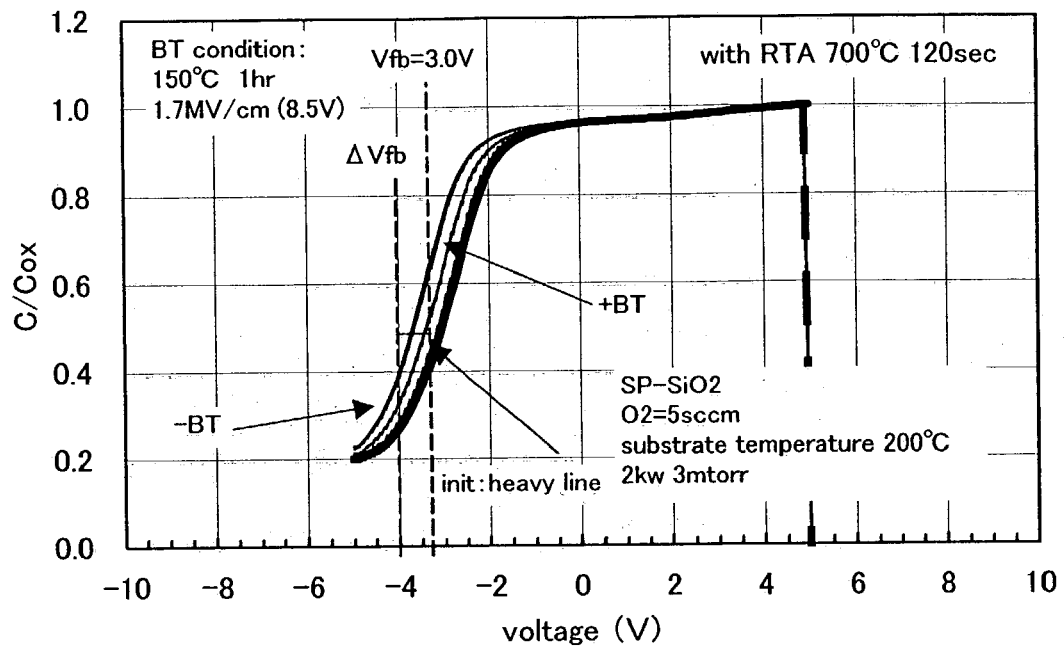
FIG. 3 is a graph showing a C-V characteristic in a sample of the MOS structure having a stacked body of a silicon oxide film and a silicon nitride film manufactured by the high-frequency sputtering method.
Figure 4:
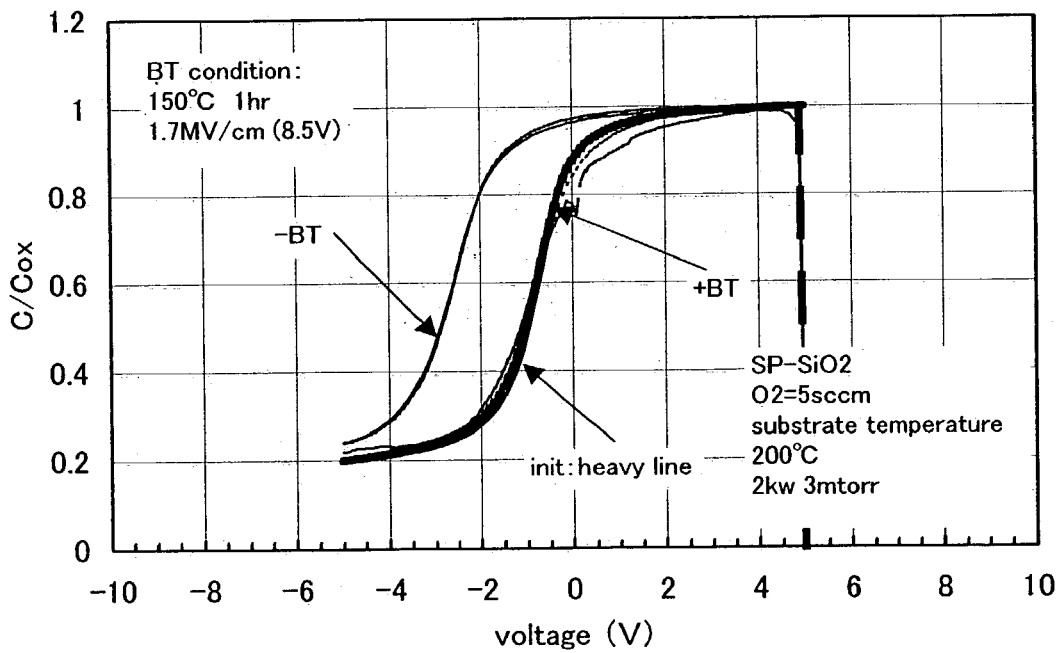
FIG. 4 is a graph showing a C-V characteristic in a sample of the MOS structure having a stacked body of a silicon oxide film and a silicon nitride film manufactured by the high-frequency sputtering method.

FIGS. 1 to 4 are graphs showing C-V characteristics in samples of the MOS structures, in which stacked bodies of silicon oxide films and silicon nitride films manufactured by the high-frequency sputtering methods are formed on silicon substrates (p-type, 1 to 10 Ωcm) and Al electrodes are formed thereon, and characteristic changes before and after applying BT stresses. FIGS. 1 and 2 show characteristics in the case in which the silicon oxide films are formed using a silicon target (condition A). For comparison with this, FIGS. 3 and 4 show characteristics in the case in which a synthetic quartz target is used (condition B). In both the cases, the silicon nitride films are formed by the high-frequency sputtering method using silicon as a target. Table 1 shows an example of representative film forming conditions of the silicon oxide film and the silicon nitride film.

TABLE 1

|  | silicon oxide film (A) | silicon oxide film (B) | silicon nitride film |
|---|---|---|---|
| gas | Ar/O$_2$ | ← | Ar/N$_2$ |
| gas flow ratio | 10/30 | ← | 20/20 |
| pressure (Pa) | 0.4 | ← | 0.8 |
| frequency (MHz) | 13.56 | ← | ← |
| power (W/cm$^2$) | 4.1 | ← | ← |
| substrate temperature (° C.) | 200 | ← | ← |
| material of target | Si(B-doped 1–10 Ω cm) | synthetic quart | ← |
| T/S (mm) | 60 | ← | ← |

Among the figures, FIGS. 2 and 4 show characteristics in the case in which a heat treatment by the RTA is not performed. In these figures, hysteresises appear due to the BT stresses application of 1.7 MV/cm at 150° C. for one hour. The appearances of hysteresises due to the BT stresses application is considered to occur due to changes in chemical bonding of the layer interfaces (e.g., disconnection of Si—O, Si—OH, etc.) or injection of charges from silicon substrates. That is, results of FIGS. 2 and 4 indicate that a fixed charge or an interface level is formed in the stacked body of the silicon oxide film and the silicon nitride film.

On the other hand, the characteristics shown in FIGS. 1 and 3 indicate results obtained by forming stacked bodies consisting of silicon oxide films and silicon nitride films and, then, performing heat treatments for 120 sec at 700° C. with the RTA, and applying the BT stresses in the same manner. As it is evident in FIG. 1, hysteresis does not appear in the silicon oxide film manufactured with a silicon target. On the other hand, it is seen that hysteresis still remains in a sample having the silicon oxide film manufactured with a synthetic quartz target shown in FIG. 3.

Table 2 shows a result of finding flat-band voltages (Vfb) of each sample and a change amounts (ΔVfb) of the flat-band voltage due to BT stress application from the C-V characteristics of FIGS. 1 to 4.

TABLE 2

|  | without heat treatment | | with heat treatment (RTA, 700° C., 2 min) | |
|---|---|---|---|---|
|  | Vfb | ÄVfb | Vfb | ÄVfb |
| SiO$_2$(Si target)\ SiN(Si target) | +0.45 | 4.91 | −0.18 | 0.17 |
| SiO$_2$(synthetic quart target)\ SiN(Si target) | −0.96 | 1.72 | −3.00 | 0.31 |

Table 2 indicates that the silicon oxide film using silicon as a target manufactured by the high-frequency sputtering method has better film quality. In addition, the decrease of hysteresis by the heat treatment indicates decrease of fixed charges (or charging defect) in the silicon oxide film and that the effect is more conspicuous in the silicon oxide film formed with a silicon target. This result indicates that, in this embodiment mode, a C-V characteristic of the MOS structure where the silicon oxide film and the silicon nitride film manufactured at a substrate heating temperature of 200° C. are stacked, can be obtained. The C-V characteristic thereof in which a fluctuation width of the flat-band voltage due to hysteresis before and after the BT stress application is 0.5 V or less, preferably 0.3 V or less can be obtained.

In addition, Table 3 shows comparison of etching speeds of silicon oxide films and silicon nitride films manufactured by various film forming methods in the etching characteristic specified as an important element for attaining the object of this embodiment mode. As an etching liquid, a mixed water solution (LAL500 SA buffered fluoric acid manufactured by Hashimoto Kasei Co., Ltd.) containing 7.13% of ammonium hydrogen fluoride (NH$_4$HF$_2$) and 15.4% of ammonium fluoride (NH$_4$F) was used to compare etching speeds at 20° C.

TABLE 3

|  | SiO2 | SiO2 | SiON | SiN | SiN |
|---|---|---|---|---|---|
| manufacturing method | RF-SP | RF-SP | PCVD | RF-SP | PCVD |
| target | Si | synthetic quart | — | Si | — |
| gas | Ar/O2 | Ar/O2 | SiH4/N2O | Ar/N2 | SiH4/ NH3/ N2/H2 |
| substrate temperature (° C,) | 200 | 200 | 400 | 200 | 325 |
| etching rate (nm/min) | <100 | <100 | 120–130 | <10 | <30 |

As shown in Table 3, etching speeds of the silicon oxide films and the silicon nitride films manufactured by the high-frequency sputtering methods using a silicon target have a characteristic in that the etching speeds are low compared with values in the plasma CVD (represented as PCVD in the table) method. The decrease in the etching speed indirectly indicates that the films are dense and also indicates that there is not defect due to a hole or fine powder. In addition, in a relation with the above-mentioned C-V characteristic, this also indicates that the denseness improves thermal and electrical stability.

As described above, according to this embodiment mode, by combining the high-frequency sputtering method using a silicon target and the heat treatment, a silicon oxide film and a silicon nitride film can be obtained which are dense even on a glass substrate thermally fragile at a substrate temperature of 300° C. or less and stable with respect to thermally and electrically exogenous stress. Such a silicon oxide film and a silicon nitride film and a stacked body thereof are useful when it is used as a gate insulating film for an insulated gate field effect transistor, in particular, a thin film transistor formed on a thermally fragile glass substrate. Naturally, the silicon oxide film and the silicon nitride film or the stacked body of this embodiment mode is not limitedly applied to a gate insulating film but can be applied to various applications such as a base insulating film formed between a semiconductor layer and a substrate, an interlayer insulating film insulating between wirings, and a protective film preventing intrusion of impurities from the outside.

Embodiments of the semiconductor device using the silicon oxide film and the silicon nitride film in accordance with the above description will be hereinafter described in detail with reference to the accompanying figures.

[Embodiment Mode 2]

An embodiment mode of forming a semiconductor device on a glass substrate with a distortion point of 700° C. or less will be described in relation to a structure in which a stacked body, which is obtained by stacking a silicon oxide film and a silicon nitride film manufactured by the high-frequency sputtering method using silicon as a target and subjected to a heat treatment, is incorporated as a gate insulating film for a TFT.

As a substrate which can be applied in this embodiment mode, a glass substrate containing barium borosilicate glass, alumino borosilicate glass, alumino silicate glass, or the like as a material is suitable. Representatively, a 1737 glass substrate (distortion point 667° C.) manufactured by Corning Incorporated, AN 100 (distortion point 670° C.) manufactured by Asahi Glass Co., Ltd., and the like are applicable. However, it goes without saying that other similar substrates may be applied without any specific limitation. In any case, it is possible to apply a glass substrate with a distortion point of 700° C. or less in this embodiment mode. Naturally, a synthetic quartz substrate with a heat resistance temperature of 1000° C. or more may be applied. According to the high-frequency sputtering method using silicon as a target in this embodiment mode, since it is possible to form a dense insulating film at the temperature of 700° C. or less, it is unnecessary to dare to select an expensive quartz substrate.

Figure 9A:
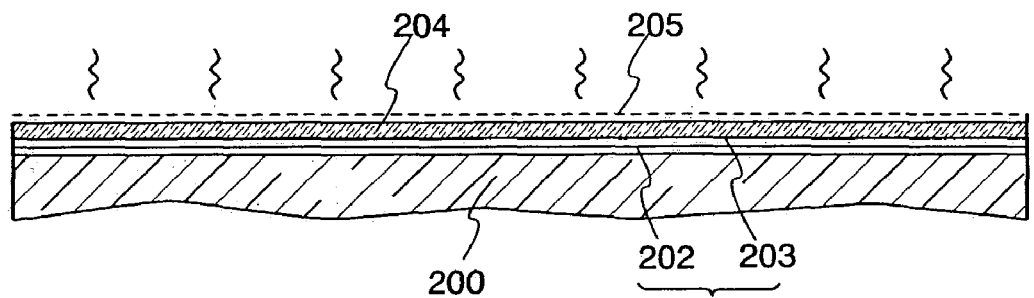
FIGS. 9A to 9D are longitudinal sectional diagrams showing steps of manufacturing the semiconductor device of the present invention.

First, as shown in FIG. 9A, a first inorganic insulator layer 201 made of an insulating film such as a silicon oxide film, a silicon nitride film, or silicon oxynitride film ($SiO_xN_y$) is formed on a glass substrate 200. A representative example is, a structure for stacking of a first silicon oxynitride film 202, which is formed by the plasma CVD with $SiH_4$, $NH_3$, and $N_2O$ as reactive gas and has a nitride content equal to larger than an oxygen content, and a second oxynitride silicon film 203, which is formed by the plasma CVD with $SiH_4$ and $N_2O$ as reactive gas and has an oxygen content larger than a nitrogen content. In this structure, the first silicon oxynitride film 202 may be replaced with a silicon nitride film which is formed by the high-frequency sputtering method. The silicon nitride film can prevent alkali metals such as Na contained in the glass substrate in a very small amount from diffusing.

A semiconductor layer forming a channel portion and source and drain portions of a TFT is obtained by crystallizing an amorphous silicon film 204 formed on the first inorganic insulator layer 201. A thickness of an amorphous silicon film to be formed first is selected in a range in which a thickness of a finished crystalline silicon film becomes 20 nm to 60 nm. An upper limit of this film thickness is an upper limit value for operating the silicon film as a film of a perfect depletion type in a channel forming region of the TFT. A lower limit value of this film thickness is a limitation on process and is determined as a minimum value which is necessary in the case, in which the crystalline silicon film is selectively processed in an etching process thereof. In addition, an amorphous silicon germanium ($Si_{1-x}Ge_x$; x=0.001 to 0.05) film may be applied instead of the amorphous silicon film.

In the process of crystallization, a method for crystallization is not specifically limited, and a metal element such as Ni having a catalytic action for crystallization of a semiconductor may be added and crystallized as a crystallization method. For example, after holding an Ni containing layer 205 on the amorphous silicon film 204, the Ni containing layer 205 is crystallized by dehydrogenation (500° C., one hour) and subsequent heating treatment at 550° C. for four hours.

Figure 9B:
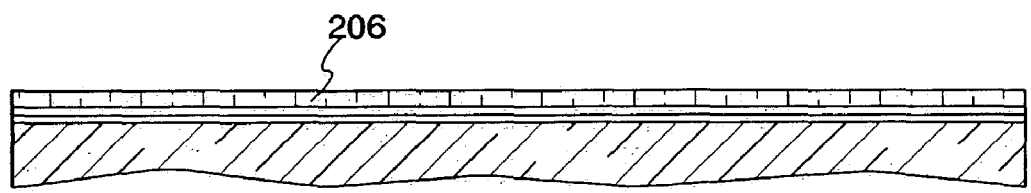
Figure 9C:
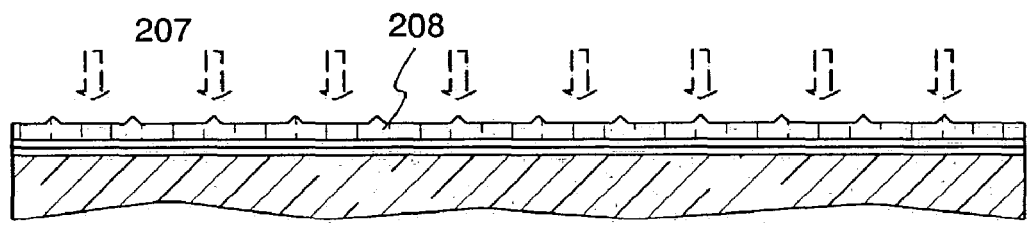

FIG. 9B shows a state in which a crystalline silicon film 206 is formed. In this state, a crystalline silicon film crystallized at a ratio of 50 to 95% is obtained. As shown in FIG. 9C, in order to further improve crystallinity, laser anneal treatment for irradiating a second higher harmonic wave of an excimer laser of pulse oscillation or a solid state laser such as an YAG laser, an $YVO_4$ laser, or an YLF laser of pulse oscillation is performed. In the laser anneal treatment, laser beams with the laser oscillator as a light source are condensed linearly by an optical system and irradiated. By this irradiation of pulse laser beams, a large number of protruded portions with a height of the same degree as a film thickness as its maximum value are formed on a surface of the crystalline silicon film as shown in FIG. 9C.

Figure 9D:
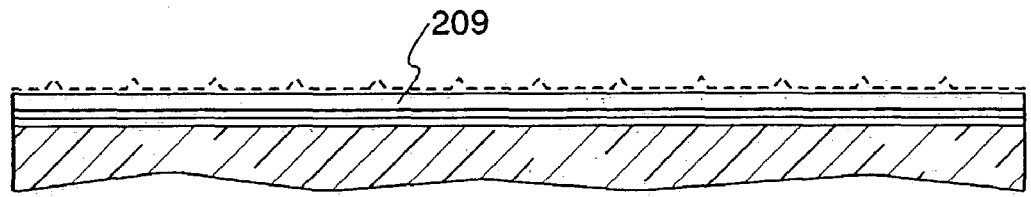

Reduction of unevenness on the surface can be realized by performing an oxidation treatment with a water solution containing ozone water and a treatment for removing an oxidized film with a water solution containing fluoric acid once, and preferably repeating the processing plural times. In this embodiment mode, in order to set a practical thickness of a gate insulating film to 30 to 80 nm and to manufacture a TFT with a channel length of 0.35 to 2.5 μm, a maximum value of unevenness is set to 10 nm or less, preferably 5 nm or less in relation to smoothness of the surface of the crystalline silicon film (FIG. 9D).

Thereafter, the obtained crystalline silicon film is etched to a desired shape by photolithography using a photo mask to form semiconductor layers 216 to 218 which are main constituent portions of the TFT. An impurity element for giving p-type may be added to the semiconductor layers 216 to 218 in order to control a threshold voltage (Vth). As the impurity element for giving p-type to the semiconductor, thirteenth family elements of the periodic law such as boron (B), aluminum (Al), and gallium (Ga) may be used (FIG. 10A).

Figure 10A:
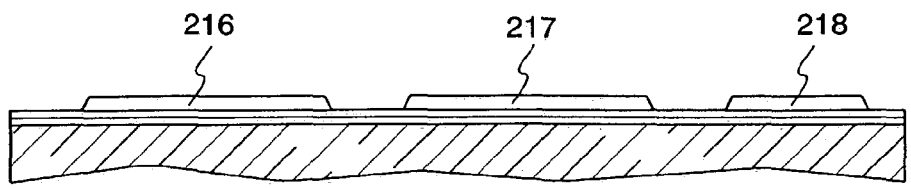
FIGS. 10A to 10E are longitudinal sectional diagrams showing steps of manufacturing the semiconductor device of the present invention.
Figure 10B:
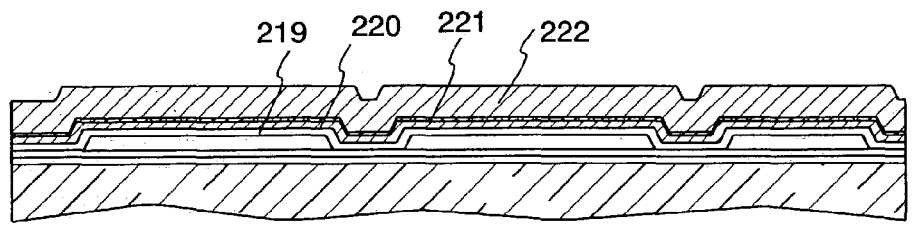

Subsequently, as shown in FIG. 10B, a silicon oxide film 219 and a silicon nitride film 220 forming a gate insulating film on the semiconductor layers 216 to 218 are formed by the high-frequency sputtering method and are subjected to a heat treatment by the RTA in the same apparatus without being exposed to the atmosphere. In this case, the multitask sputtering apparatus illustrated in FIG. 5 has a structure suitable for this process. An outline of this process is described below.

First, a substrate to be carried from the load/unload chamber 111 is in a state of FIG. 10A. The above-mentioned smoothing treatment of the surface can be performed in the pre-treatment chamber 112 provided with a spinner. With the smoothing treatment, the oxidation treatment with a water solution containing ozone water and the treatment for removing oxidized film with a water solution containing fluoric acid are performed to etch the surface of the semiconductor film around a protruded portion. In addition, there is also a characteristic that an uppermost surface of the semiconductor film is etched by this treatment and an inactive surface is formed by cleaning terminated by hydrogen.

Thereafter, the substrate is conveyed to the exhausted first common chamber 101 through the intermediate chamber 108. In the film forming chamber 104, a silicon oxide film is formed in a thickness of 10 to 60 nm with silicon (B dope, 1 to 10 Ωcm) as a target by the high-frequency sputtering method. As representative film forming conditions, $O_2$ and Ar are used as a sputtering gas, and a mixing ratio (flow amount ratio) thereof is set to 1:3. A pressure at the time of sputtering is set to 0.4 Pa, discharge electric power is set to 4.1 W/cm$^2$ (13.56 MHz), and a substrate heating temperature is set to 200° C. According to these conditions the silicon oxide film 219, which has a low interface level density in an interface with the semiconductor film and is dense, can be formed.

In addition, prior to deposition of the silicon oxide film, surface treatment such as heating treatment or oxygen plasma treatment under reduced pressure may be performed in the preliminary heating chamber 103. If the surface is oxidized by the oxygen plasma treatment, the interface level density can be reduced.

Subsequently, the substrate is transferred to the film forming chamber 105 to form a silicon nitride film in a thickness of 10 to 30 nm by the high-frequency sputtering method. As representative film forming conditions, $N_2$ and Ar are used as a sputtering gas and a mixing ratio (flow amount ratio) thereof is set to 1:1. A pressure at the time of sputtering is set to 0.8 Pa, discharge electric power is set to 4.1 W/cm$^2$ (13.56 MHz), and a substrate heating temperature is set to 200° C.

Since a relative dielectric constant of silicon nitride is approximately 7.5 as opposed to 3.8 of silicon oxide, by containing the silicon nitride film in a gate insulating film formed of the silicon oxide film, an effect substantially equivalent to realizing thinning of the gate insulating film can be obtained. In relation to smoothness of the surface of the semiconductor film, a maximum value of unevenness is set to 10 nm or less, preferably 5 nm or less, and a two layer structure of the silicon oxide film and the silicon nitride film is adopted in the gate insulating film, whereby a gate leak current can be reduced even if a total thickness of the gate insulating film is set to 30 to 80 nm, and the TFT can be driven at 2.5 to 10 V, representatively 3.0 to 5.5 V.

After forming the silicon oxide film 219 and the silicon nitride film 220, a heat treatment is performed in the heat treatment chamber 120. As a representative heat treatment condition, the heat treatment is performed at 700° C. for a processing time of 120 sec while $N_2$ is being flown. According to this processing, a very small silicon cluster taken into the film can be oxidized or nitrided, and internal distortion can be eased to reduce a defect density in a film and a defect density on a layer interface.

Moreover, four layers of first conductive films 221 and second conductive films 222 forming a gate electrode are continuously formed under reduced pressure without being exposed to the atmosphere. After forming the gate insulating film, subsequently, a first conductive film 221 consisting of tantalum nitride (TaN) with a thickness of 10 to 50 nm and a second conductive film 222 consisting of tungsten (W) with a thickness of 100 to 400 nm are stacked and formed. As a conductive material for forming the gate electrode, an element selected out of Ta, W, Ti, Mo, Al, and Cu or an alloy material or a compound material containing the metal element as a main component is used. A particularly preferable form is a combination of nitride metal containing the conductive material and the conductive material. For example, a combination of a first conductive film formed of a tantalum nitride (TaN) film and a second conductive film formed of an Al film or a combination of a first conductive film formed of tantalum nitride (TaN) film and a second conductive film formed of a Ti film may be adopted. In addition, a semiconductor film represented by a polycrystalline silicon film doped with an impurity element such as phosphorous may be used.

Figure 10C:
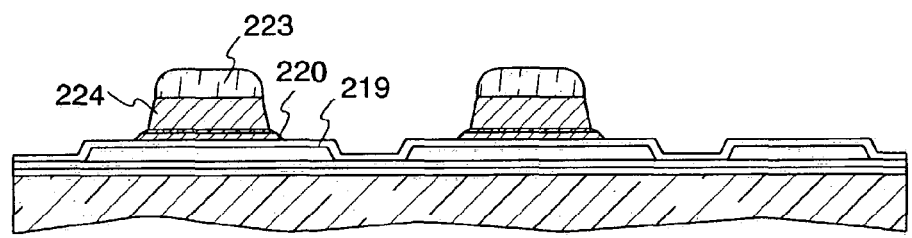

Next, as shown in FIG. 10C, a resist mask 223 forming a gate electrode pattern is provided. Thereafter, first etching treatment is performed by the dry etching method. For example, the inductively coupled plasma (ICP) etching method is applied to the etching. There is no limitation for etching gas, but $CF_4$, $Cl_2$, and $O_2$ are used for etching of W or TaN. In the first etching treatment, a predetermined bias voltage is applied to a substrate side, and an inclination of 15 to 50 degrees is given to a side of a gate electrode pattern 224 of a first shape to be formed. Depending upon etching conditions, the silicon nitride film 220 formed as the gate insulating film by the first etching treatment remains under the gate electrode pattern 224 of the first shape, and the silicon oxide film 219 is exposed.

Figure 10D:
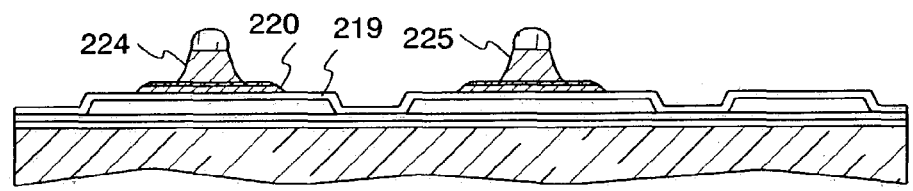

Thereafter, the etching conditions are changed to second etching conditions, and anisotropic etching of the W film is performed using $SF_6$, $Cl_2$, and $O_2$ as etching gas and setting a bias voltage applied to the substrate side to a predetermined value. In this way, gate electrodes 224 and 225 are formed (FIG. 10D), thereafter, the resist mask 223 is removed.

Figure 10E:
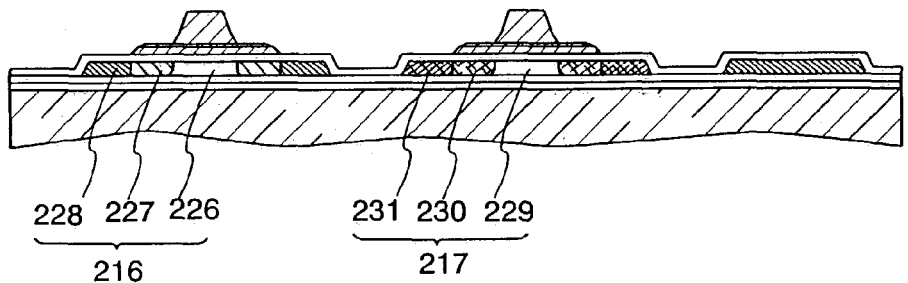

The gate electrode is a stacked structure of the first conductive film 221 and the second conductive film 222 and has a structure in which the first conductive film protrudes like eaves. Thereafter, doping treatment is performed to form an impurity region in each semiconductor film as shown in FIG. 10E. Doping conditions have to be set appropriately. First n-type impurity regions 227 formed in the semiconductor film 216 form low concentration drains and second n-type impurity regions 228 formed therein form source or drain regions. First p-type impurity regions 230 formed in the semiconductor film 217 form low concentration drains and second p-type impurity regions 231 formed therein form source or drain regions. Channel forming regions 226 and 229 in the respective semiconductor film are located between the low concentration drains. The semiconductor film 218 is a member for forming a capacitor portion, and impurities are added to the semiconductor film 218 in the same concentration as to the second n-type impurity regions 228.

Figure 11A:
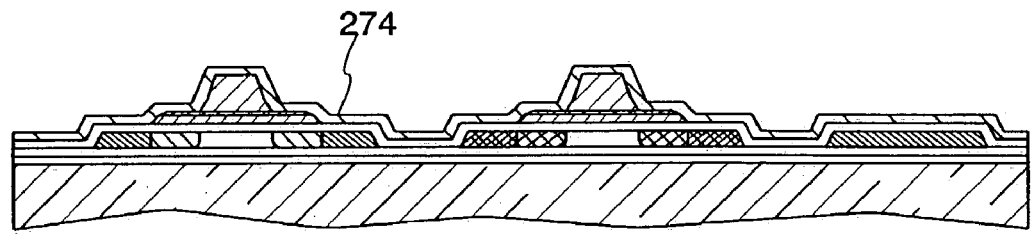
FIGS. 11A to 11C are longitudinal sectional diagrams showing steps of manufacturing the semiconductor device of the present invention.

Then, as shown in FIG. 11A, a silicon oxynitride film 274 containing hydrogen is formed in a thickness of 50 nm by the plasma CVD method to perform hydrogenation of the semiconductor film by heating treatment at 410° C. In addition, activation treatment of the above-mentioned impurity regions can also be performed simultaneously with the hydrogenation.

Figure 11B:
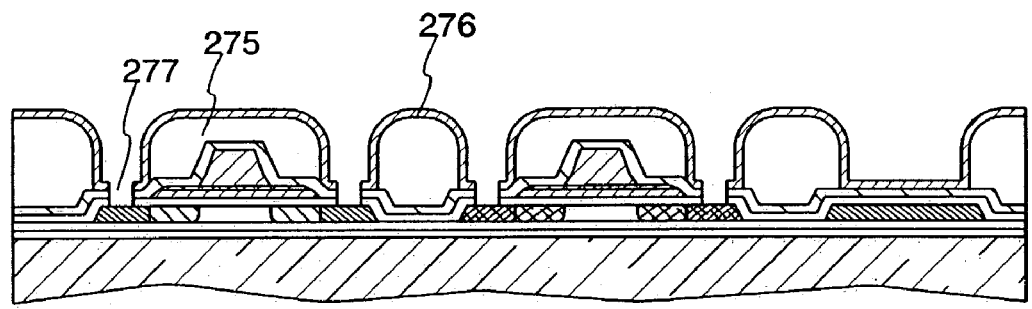

An interlayer insulating film 275 is formed of a photosensitive organic resin material containing acrylic, polyimide, or the like as a main component in a predetermined pattern. A protective film 276 is formed of a silicon nitride film by the high-frequency sputtering method. If a film thickness is set to 20 to 500 nm, a blocking action for preventing intrusion of impurities of various kinds of ionicity such as oxygen and moisture in the air can be obtained. Then, contact holes 277 are formed by dry etching (FIG. 11B).

Figure 11C:
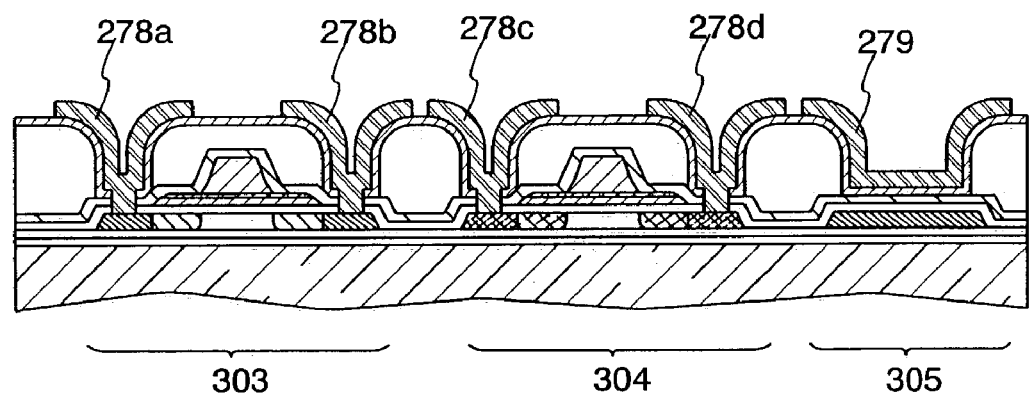

Thereafter, as shown in FIG. 11C, wirings 278a to 278d and 279 are formed using Al, Ti, Mo, W, or the like. In an example of a wiring structure, a stacked film of a Ti film with a thickness of 50 to 250 nm and an alloy film (alloy film of Al and Ti) with a thickness of 300 to 500 nm is used.

In this way, an n-channel type TFT 303, a p-channel type TFT 304, and a capacitor portion 305 can be formed. In each TFT, a silicon nitride film is included in the gate insulating film at least one layer. In addition, in the capacitor portion 305, a silicon nitride film (276) is included as a dielectric film at least one layer.

The stacked body of this embodiment mode, which is obtained by stacking a silicon oxide film and a silicon nitride film manufactured by the high-frequency sputtering method using silicon as a target and subjecting the films to heating treatment, is applied to a gate insulating film of a TFT, whereby a TFT with less fluctuation of a threshold voltage or a sub-threshold characteristic can be obtained. That is, it is possible to form a gate insulting film with a dense silicon oxide film or a stacked body of a silicon oxide film and a silicon nitride film, which does not contain hydrogen and does not include fixed charges through the heating treatment. Therefore, the stacked body can contribute stability of characteristics of the TFT.

[Embodiment Mode 3]

Figure 12:
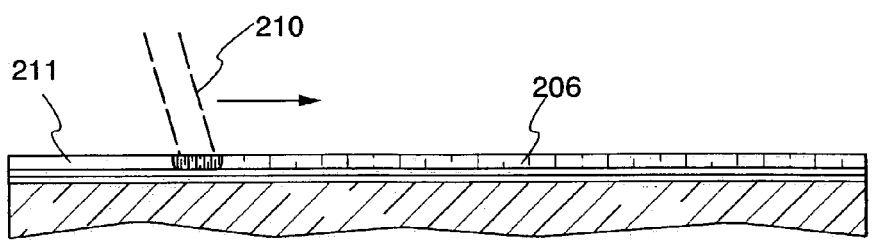
FIG. 12 is a longitudinal sectional diagram showing a step of manufacturing the semiconductor device of the present invention.

After the crystalline silicon film shown in FIG. 9B is obtained in Embodiment Mode 2, a laser oscillator using crystals of YAG, YVO$_4$, YLF, YalO$_3$, or the like doped with Cr, Nd, Er, Ho, Ce, Co, Ti, or Tm is applied to the film as a solid state laser of a continuous oscillation type as shown in FIG. 12. A basic wave in the laser oscillator is different depending upon a material to be doped, and a laser beam having the basic wave of about 1 μm is obtained. A higher harmonic wave as opposed to the basic wave can be obtained by using a nonlinear optical element. In the case in which the above-mentioned laser oscillator is used, a wavelength in a visible light region is substantially obtained with a second harmonic and a wavelength of an ultraviolet region is substantially obtained with a third harmonic. Representatively, an Nd:YVO$_4$ laser oscillator (basic wave: 1064 nm) is used to apply a second harmonic thereof (532 nm). Laser beams of this oscillator are condensed linearly or in a rectangular shape to perform scanning at a speed of 1 to 100 cm/sec, whereby improvement of crystallinity is realized. By using a continuous oscillation laser in this process, crystal grains extend in a scanning direction of the laser beams, and a crystalline silicon film with a smooth surface can be obtained and a maximum value of unevenness of the surface can be reduced to 10 nm or less, preferably 5 nm or less.

[Embodiment Mode 4]

In a glass substrate containing barium borosilicate glass, alumino borosilicate glass, alumino silicate glass, or the like as a material, shrinkage of several ppm to several hundreds ppm occurs due to heating treatment even in a temperature equal to or lower than a distortion point. As a design rule is reduced, mask alignment accuracy increases. However, the shrinkage of the substrate causes displacement of an alignment marker and hinders a light exposure process. This embodiment provides an example of a process which is capable of completing a TFT without trouble even if a glass substrate shrinks due to the RTA treatment.

First, a conductive layer for forming a gate insulating film and a gate electrode is formed on a crystalline semiconductor film. As in the first embodiment, the gate insulting film is formed by stacking a silicon oxide film and a silicon nitride film with the high-frequency sputtering method using silicon as a target. Thereafter, the RTA treatment is performed at 700° C. for 120 sec. Very small silicon clusters taken into the gate insulating film can be oxidized or nitrided and internal distortion can be eased by this heating treatment to reduce defect densities in a film and defect level densities on an interface. Although the glass substrate shrinks at a ratio of several tens ppm due to this RTA treatment, since an alignment marker is not formed on the substrate at this stage, subsequent processes are not hindered.

Figure 13:
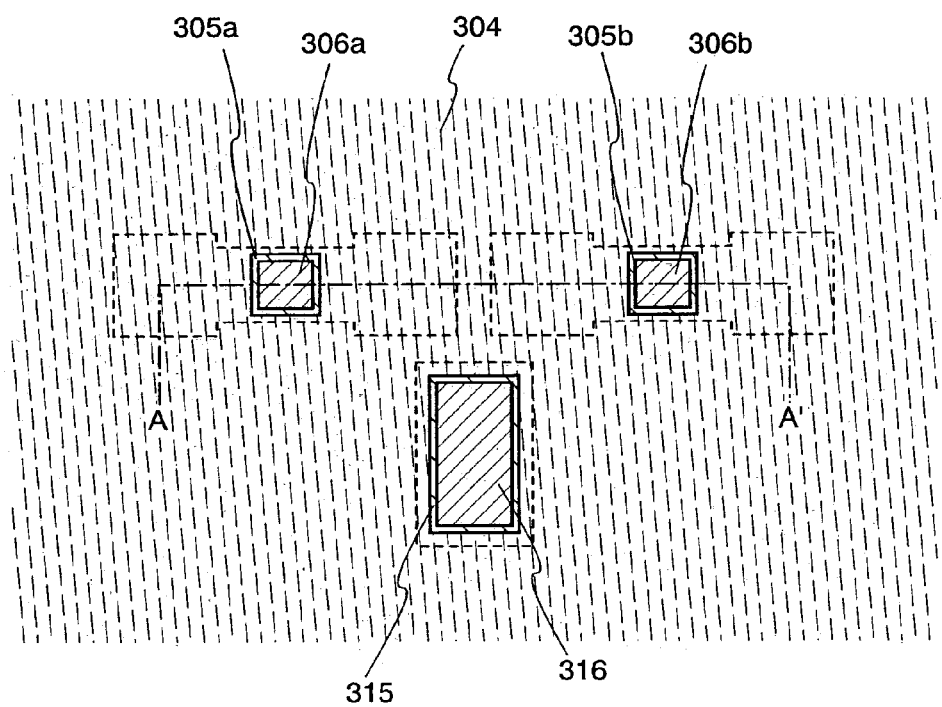
FIG. 13 is a top view showing a step of manufacturing the semiconductor device of the present invention.
Figure 17:
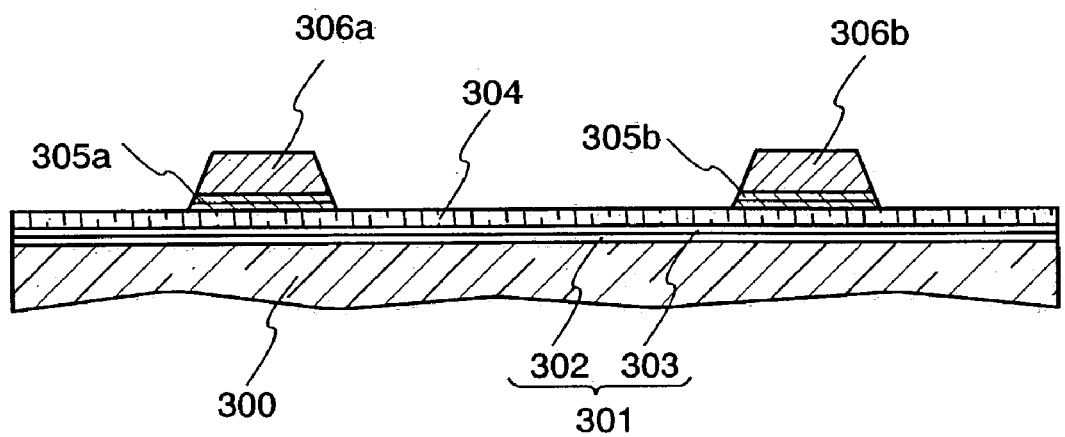
FIG. 17 is a longitudinal sectional view showing a step of manufacturing the semiconductor device of the present invention.

Then, as shown in FIG. 13, positions of gate electrodes 306a and 306b are decided to form a pattern using dry etching. Simultaneously, the gate insulating layer below the gate electrodes is also etched to expose a surf ace of a semiconductor film 304. A longitudinal sectional view corresponding to line A–A' in this state is shown in FIG. 17. A silicon nitride film 302 and a silicon oxynitride film 303 are stacked and formed as a base insulating film 301 on a glass substrate 300. The semiconductor film 304 is formed over the entire surface, and patterns of a gate insulating film 305a, a gate electrode 306a, a gate insulating film 305b, and a gate electrode 306b are formed thereon. Note that reference numerals 315 and 316 in FIG. 13 denote a gate insulating film 315 and a gate electrode 316, respectively, forming a stacked body, which are disposed for the purpose of forming wiring.

Figure 14:
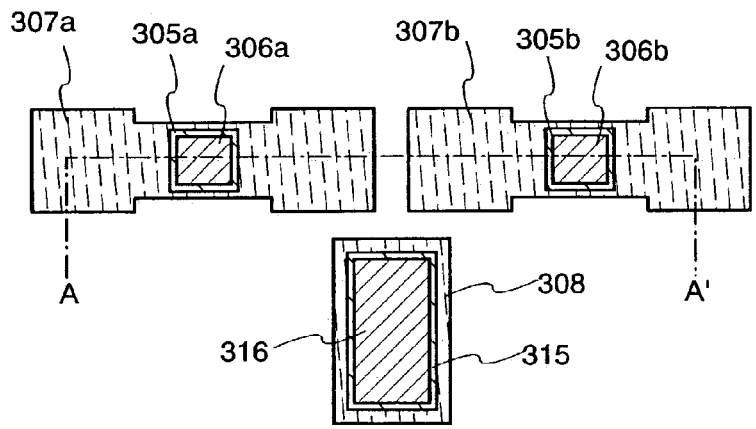
FIG. 14 is a top view showing a step of manufacturing the semiconductor device of the present invention.

After positions of the gate electrodes are decided, the semiconductor film 304 is formed in an island shape in accordance with the positions. FIG. 14 is a plan view of a state in which semiconductor films 307a and 307b are formed in an island shape. Since it is possible to align a photo mask in accordance with the arrangement of the gate electrodes 306a and 306b, an accuracy of position of crossing portions of the semiconductor films and the gate electrodes, that is, the accuracy of position of channel portions can be increased. Note that, according to this process, a semiconductor layer also remains under the wiring 316.

Figure 15:
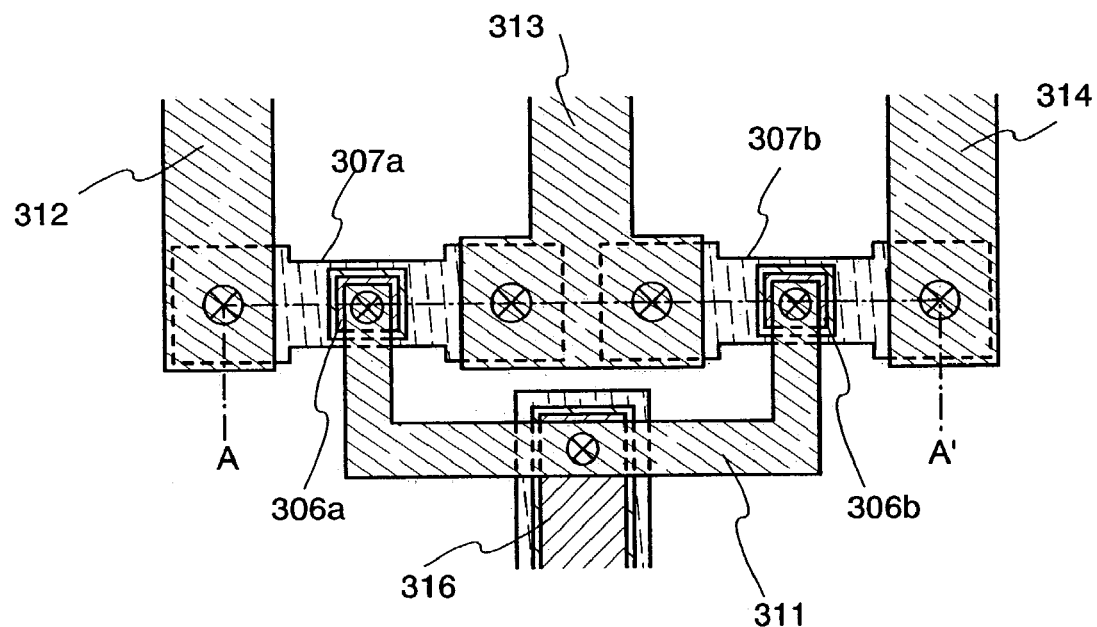
FIG. 15 is a top view showing a step of manufacturing the semiconductor device of the present invention.
Figure 18:
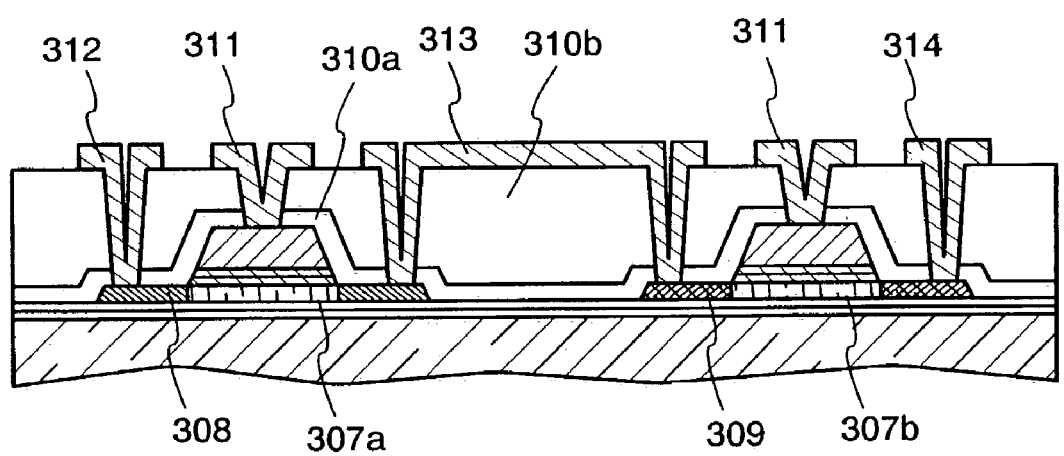
FIG. 18 is a longitudinal sectional view showing a step of manufacturing the semiconductor device of the present invention.

Thereafter, an interlayer insulating film is formed, and wirings 311 to 313 are formed as shown in FIG. 15. The wiring 311 is a wiring connected to the gate electrodes 306a and 306b. The wirings 312 and 313 are wirings connected to a source or drain region formed in the semiconductor films 307a and 307b. FIG. 15 shows an example of a wiring pattern forming an inverter circuit. However, a structure for connecting wirings is not limited to this. In any case, it is possible to form a desired circuit using a conductive layer formed in the same layer as the gate electrodes and a conductive layer formed on the interlayer insulating film. FIG. 18 is a longitudinal sectional view corresponding to line A–A' at this stage. The interlayer insulating film is a stacked body of an inorganic insulating film 310a and a photosensitive or non-photosensitive organic insulating film 310b, and the wirings 311 to 313 are formed thereon.

Figure 16:
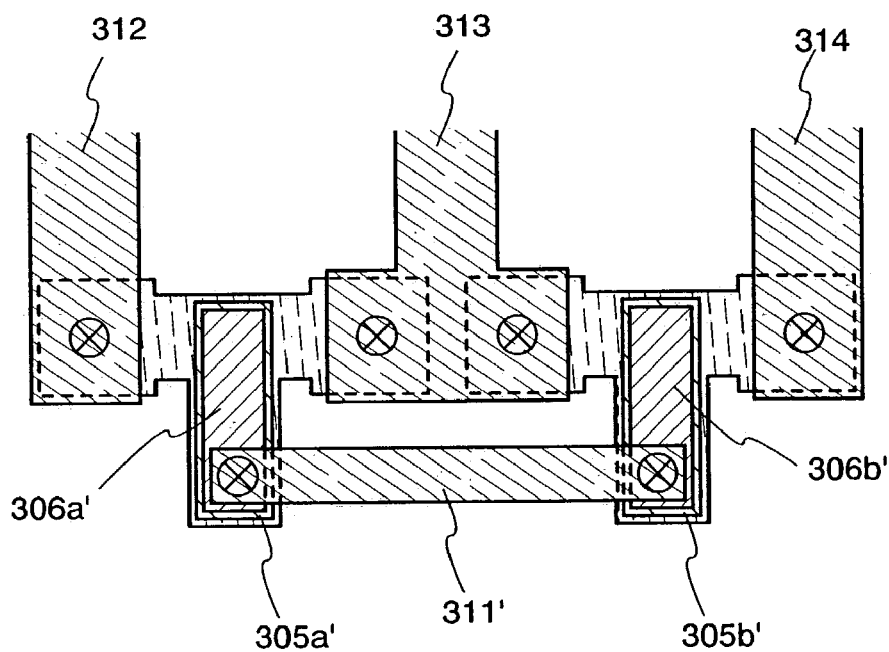
FIG. 16 is a top view showing a step of manufacturing the semiconductor device of the present invention.

FIG. 16 shows a modified example, which corresponds to refining of a TFT and shows an arrangement for securing a margin for alignment accuracy of contact portions. Instead of disposing the contact portions with the gate electrodes 306a and 306b on channel portions, contact pads are formed as extension from the channel portions.

As described above, a silicon oxide film and a silicon nitride film manufactured by the sputtering method are subjected to a heat treatment before forming a pattern of a semiconductor film or a gate electrode and, using the silicon oxide film and the silicon nitride film as a gate insulating film, a TFT can be formed with high accuracy without deviation of a pattern.

[Embodiment Mode 5]

Figure 19:
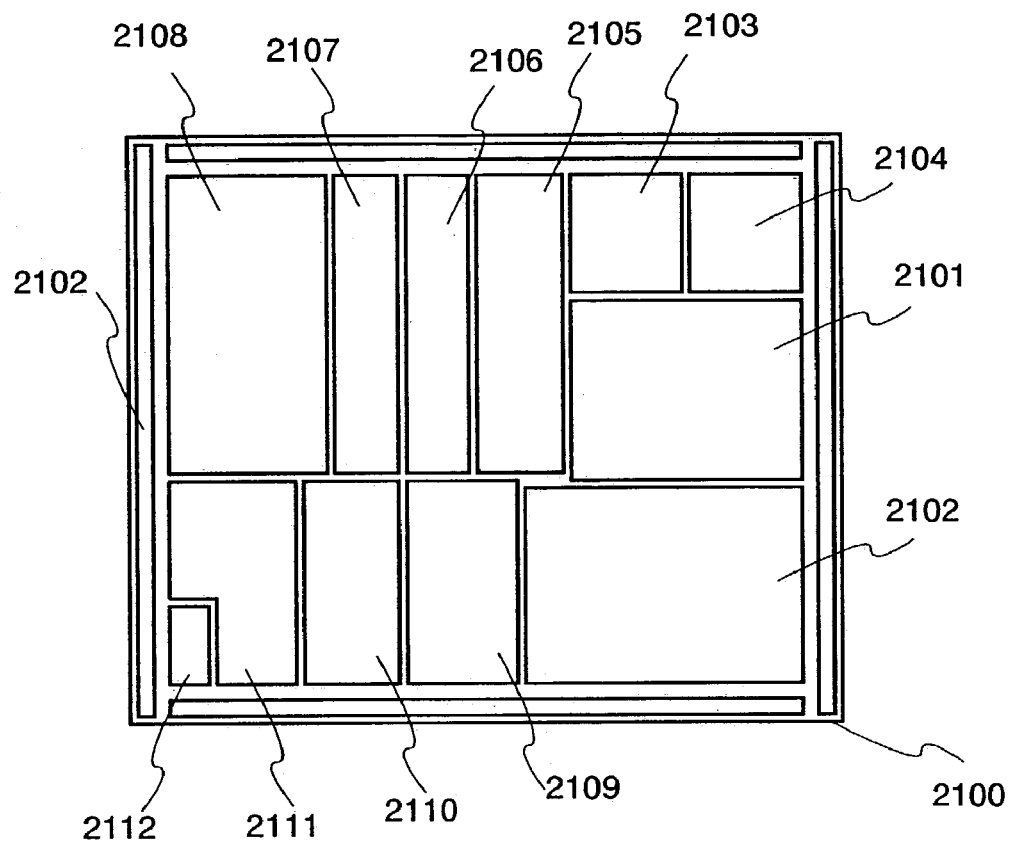
FIG. 19 shows a structure of the microcomputer according to the present invention.
Figure 20:
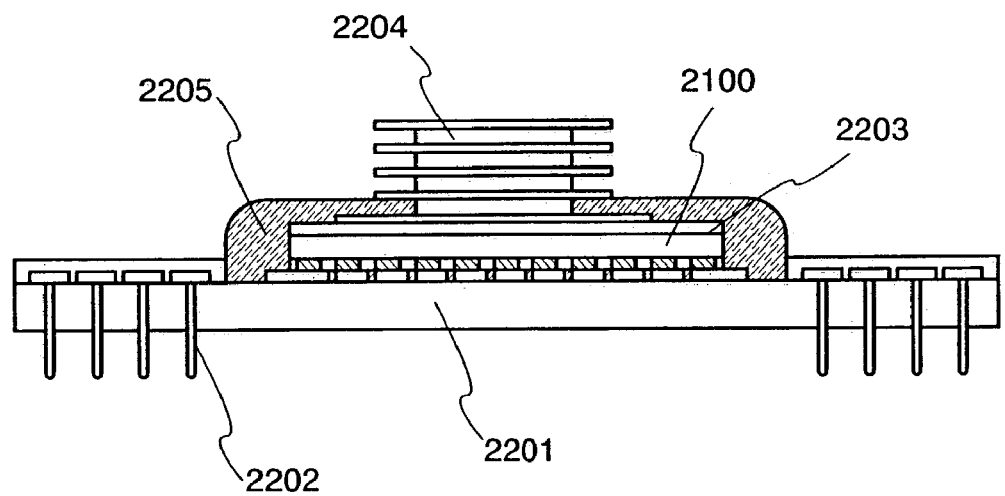
FIG. 20 shows a package structure of the microcomputer according to the present invention.

An embodiment mode of a microcomputer will be described as a representative semiconductor device manufactured according to Embodiment Modes 2 to 4 with reference to FIGS. 19 and 20. As shown in FIG. 19, the microcomputer can be realized by integrating various functional circuit sections on a glass substrate with a thickness of 0.3 to 1.1 mm. It is possible to form the various functional circuit sections with a TFT and a capacitor portion manufactured according to Embodiment Modes 2 to 4 as main bodies.

Elements of a microcomputer 2100 shown in FIG. 19 includes a CPU 2101, a ROM 2102, an interrupt controller 2103, a cache memory 2104, a RAM 2105, a DMAC 2106, a clock generation circuit 2107, a serial interface 2108, a power supply generation circuit 2109, an ADC/DAC 2110, a timer/counter 2111, a WDT 2112, an I/O port 2102, and the like.

The microcomputer 2100 formed on a glass substrate is adhered to a base 2201 of ceramics or FRP (fiber reinforced plastic) by face down bonding. The back of the glass substrate of the microcomputer 2100 is coated with aluminum oxynitride 2203 with high thermal conductivity to improve a heat dissipation effect. Moreover, a heat radiation fin 2204 formed of aluminum is further provided in contact with the aluminum oxynitride 2203 as a countermeasure for heat generation following an operation of the microcomputer 2100. The entire microcomputer 2100 is covered by sealing resin 2205, and connection with external circuits is performed by pins 2202.

In this embodiment mode, a form of a microcomputer is described as an example. However, semiconductor devices with various functions such as a media processor, a graphics LSI, an encryption LSI, a memory, and an LSI for cellular phones can be completed by changing structures and combinations of various functional circuits.

According to the present invention, an insulating film of good quality with a low fixed charge density or interface level density can be obtained, as is clear from a C-V characteristic. The insulating film is suitable for a gate insulating film. After forming a silicon oxide film and a silicon nitride film by a high-frequency sputtering method and subjecting the films to a heat treatment (RTA treatment is highly preferred), a conductive film is formed thereon by a DC sputtering method using metal as a target. Since all steps from a step for forming a silicon nitride film on a crystalline semiconductor film to a step for forming the conductive film are continuously performed without exposing the films to the atmosphere, physical contamination due to particulates or the like and chemical contamination due to an environment around the films are prevented and a clean interface can be formed.

Since a relative dielectric constant of the silicon nitride is approximately 7.5 as opposed to 3.8 of the silicon oxide, by containing the silicon nitride film in a gate insulating film formed of the silicon oxide film, an effect substantially equivalent to realizing thinning of the gate insulating film can be obtained, and it becomes possible to reduce gate leak. An advantageous effect can be obtained with respect to refining of elements based upon a scaling rule. Moreover, by using a dense silicon nitride film as a constituent member of the gate insulating film, the gate insulating film can be caused to function as a protective film for preventing intrusion of impurities from the outside, and a clean interface can be formed between the gate insulating film and the semiconductor film.

What is claimed is:

1. A manufacturing method of a semiconductor device, comprising the steps of:

forming a silicon oxide film over a semiconductor film formed on an insulating surface by applying high-frequency power in an atmosphere containing oxygen or oxygen and a rare gas with a sputtering method using silicon as a target;

forming a silicon nitride film over the silicon oxide film by applying high-frequency power in an atmosphere containing nitrogen or nitrogen and a rare gas;

performing a heat treatment after forming the silicon oxide film and the silicon nitride film;

forming a gate electrode over the silicon nitride film; and etching the semiconductor film in an island shape after forming the gate electrode.

2. The manufacturing method of the semiconductor device according to claim 1, wherein the heat treatment is performed in a nitrogen atmosphere.

3. The manufacturing method of the semiconductor device according to claim 1, wherein the gate electrode is formed with a DC sputtering method using metal as a target, wherein the steps from forming the silicon oxide film to forming the gate electrode are performed continuously without exposing the films to the atmosphere.

4. A manufacturing method of a semiconductor device, comprising the steps of:

forming a silicon oxide film over a semiconductor film formed on an insulating surface by applying high-frequency power in an atmosphere containing oxygen or oxygen and a rare gas with a sputtering method using silicon as a target;

forming a silicon nitride film over the silicon oxide film by applying high-frequency power in an atmosphere containing nitrogen or nitrogen and a rare gas;

performing a heat treatment after forming the silicon oxide film and the silicon nitride film 1 to 240 seconds;

forming a gate electrode over the silicon nitride film; and etching the semiconductor film in an island shape after forming the gate electrode.

5. The manufacturing method of the semiconductor device according to claim 4,
wherein the heat treatment is performed in a nitrogen atmosphere.

6. The manufacturing method of the semiconductor device according to claim 4,
wherein the gate electrode is formed with a DC sputtering method using metal as a target,
wherein the steps from forming the silicon oxide film to forming the gate electrode are performed continuously without exposing the films to the atmosphere.

7. A manufacturing method of a semiconductor device, comprising the steps of:
forming a silicon oxide film over a semiconductor film formed on an insulating surface by applying high-frequency power in an atmosphere containing oxygen or oxygen and a rare gas with a sputtering method using silicon as a target;
forming a silicon nitride film over the silicon oxide film by applying high-frequency power in an atmosphere containing nitrogen or nitrogen and a rare gas;
performing a heat treatment after forming the silicon oxide film and the silicon nitride film using a rapid thermal annealing method;
forming a gate electrode over the silicon nitride film; and
etching the semiconductor film in an island shape after forming the gate electrode.

8. The manufacturing method of the semiconductor device according to claim 7,
wherein the heat treatment is performed in a nitrogen atmosphere.

9. The manufacturing method of the semiconductor device according to claim 7,
wherein the gate electrode is formed with a DC sputtering method using metal as a target,
wherein the steps from forming the silicon oxide film to forming the gate electrode are performed continuously without exposing the films to the atmosphere.

10. A manufacturing method of a semiconductor device, comprising the steps of:
forming a silicon oxide film over a semiconductor film formed on an insulating surface by applying high-frequency power in an atmosphere containing oxygen or oxygen and a rare gas with a sputtering method using silicon as a target;
forming a silicon nitride film over the silicon oxide film by applying high-frequency power in an atmosphere containing nitrogen or nitrogen and a rare gas;
performing a heat treatment of rapid heating after forming the silicon oxide film and the silicon nitride film lamp heating
forming a gate electrode over the silicon nitride film; and
etching the semiconductor film in an island shape after forming the gate electrode.

11. The manufacturing method of the semiconductor device according to claim 10,
wherein the heat treatment is performed in a nitrogen atmosphere.

12. The manufacturing method of the semiconductor device according to claim 10,
wherein the gate electrode is formed with a DC sputtering method using metal as a target,
wherein the steps from forming the silicon oxide film to forming the gate electrode are performed continuously without exposing the films to the atmosphere.

13. A manufacturing method of a semiconductor device, comprising the steps of:
forming a semiconductor film over a substrate having an insulating surface;
sequentially depositing a silicon oxide film applying high-frequency power in an atmosphere containing oxygen or oxygen and a rare gas with a sputtering method using silicon as a target, and a silicon nitride film applying high-frequency power in an atmosphere containing nitrogen or nitrogen and a rare gas with a sputtering method using silicon as a target on the semiconductor film formed over the substrate to form a stacked body;
subjecting the stacked body to a heat treatment at 600 to 800° C.;
forming a gate electrode over the stacked body; and
etching the semiconductor film in an island shape after forming the gate electrode.

14. A manufacturing method of a semiconductor device, comprising the steps of:
forming a semiconductor film over a substrate having an insulating surface;
sequentially depositing a silicon oxide film applying high-frequency power in an atmosphere containing oxygen or oxygen and a rare gas with a sputtering method using silicon as a target, and a silicon nitride film applying high-frequency power in an atmosphere containing nitrogen or nitrogen and a rare gas with a sputtering method using silicon as a target on the semiconductor film formed over the substrate to form a stacked body on an upper layer side of the semiconductor film;
performing a heat treatment of the stacked body with a rapid thermal annealing method for heating the stacked body to a temperature equal to or higher than a distortion point of the substrate;
forming a gate electrode over the stacked body; and
etching the semiconductor film in an island shape after forming the gate electrode.

* * * * *